(12) United States Patent
Teraguchi et al.

(10) Patent No.: US 11,778,869 B2
(45) Date of Patent: *Oct. 3, 2023

(54) DISPLAY UNIT AND ELECTRONIC APPARATUS INCLUDING FUNCTIONAL LAYER WITH LIGHT-EMITTING LAYER AND HOLE INJECTION LAYER

(71) Applicant: Sony Group Corporation, Tokyo (JP)

(72) Inventors: Shinichi Teraguchi, Kanagawa (JP); Eisuke Negishi, Tokyo (JP); Shuji Kudo, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/551,465

(22) Filed: Dec. 15, 2021

(65) Prior Publication Data

US 2022/0181415 A1 Jun. 9, 2022

Related U.S. Application Data

(63) Continuation of application No. 16/133,014, filed on Sep. 17, 2018, now Pat. No. 11,222,937, which is a
(Continued)

(30) Foreign Application Priority Data

Feb. 6, 2014 (JP) .................................. 2014-021603

(51) Int. Cl.
*H10K 59/123* (2023.01)
*H10K 50/818* (2023.01)
(Continued)

(52) U.S. Cl.
CPC ......... *H10K 59/123* (2023.02); *H10K 50/818* (2023.02); *H10K 50/856* (2023.02);
(Continued)

(58) Field of Classification Search
CPC ............. H01L 27/3248; H01L 27/3258; H01L 51/5218; H01L 51/5271; H01L 27/3246; H01L 27/3276; H01L 51/5234
(Continued)

(56) References Cited

U.S. PATENT DOCUMENTS 5,877,832 A 3/1999 Shimada
2001/0019133 A1 9/2001 Konuma
(Continued)

FOREIGN PATENT DOCUMENTS

JP H09-304793 A 11/1997
JP 2001-148291 5/2001
(Continued)

*Primary Examiner* — Xia L Cross
(74) *Attorney, Agent, or Firm* — Michael Best & Friedrich LLP

(57) ABSTRACT

A display unit includes: a drive wire; a planarization layer covering the drive wire and having a connection hole; a relay electrode provided on the planarization layer and configured to be electrically connected to the drive wire through the connection hole; a filling member made of an insulating material and provided in the connection hole; a first partition wall made of a same material as that of the filling member and covering an end of the relay electrode; a first electrode covering the filling member and configured to be electrically connected to the relay electrode; a second electrode facing the first electrode; and a functional layer located between the first electrode and the second electrode, the functional layer including a light-emitting layer.

18 Claims, 34 Drawing Sheets

Related U.S. Application Data continuation of application No. 14/603,816, filed on Jan. 23, 2015, now Pat. No. 10,109,693.

(51) Int. Cl.
*H10K 50/856* (2023.01)
*H10K 59/124* (2023.01)
*H10K 50/828* (2023.01)
*H10K 59/38* (2023.01)
*H10K 59/122* (2023.01)
*H10K 59/131* (2023.01)

(52) U.S. Cl.
CPC ......... *H10K 59/124* (2023.02); *H10K 50/828* (2023.02); *H10K 59/122* (2023.02); *H10K 59/131* (2023.02); *H10K 59/38* (2023.02)

(58) Field of Classification Search
USPC .......................................................... 257/40
See application file for complete search history.

(56) References Cited

U.S. PATENT DOCUMENTS

| | | |
|---|---|---|
| 2002/0101152 A1 | 8/2002 | Kimura |
| 2005/0082534 A1 | 4/2005 | Kim et al. |
| 2007/0102737 A1 | 5/2007 | Kashiwabara |
| 2011/0147757 A1 | 6/2011 | Kim et al. |
| 2011/0193107 A1 | 8/2011 | Takeuchi et al. |
| 2011/0198624 A1 | 8/2011 | Matsushima |
| 2011/0266548 A1 | 11/2011 | Yamazaki et al. |
| 2013/0126843 A1 | 5/2013 | Nishiyama |
| 2015/0053955 A1 | 2/2015 | Furuie |

FOREIGN PATENT DOCUMENTS

| | | |
|---|---|---|
| JP | 2002-175029 A | 6/2002 |
| JP | 2002-287663 A | 10/2002 |
| JP | 2007-165214 A | 6/2007 |
| JP | 2008-130363 | 6/2008 |
| JP | 2015-041489 A | 3/2015 |

DISPLAY UNIT AND ELECTRONIC APPARATUS INCLUDING FUNCTIONAL LAYER WITH LIGHT-EMITTING LAYER AND HOLE INJECTION LAYER

CROSS REFERENCE TO RELATED APPLICATIONS

The present application is a Continuation of application Ser. No. 16/133,014, filed Sep. 17, 2018, which is a Continuation of application Ser. No. 14/603,816, filed Jan. 23, 2015, now U.S. Pat. No. 10,109,693, issued on Oct. 23, 2018, which claims the benefit of Japanese Priority Patent Application JP 2014-021603 filed Feb. 6, 2014, the entire contents which are incorporated herein by reference.

BACKGROUND

The present technology relates to a display unit including, for example, a functional layer such as an organic layer, a method of manufacturing the same, and an electronic apparatus.

Recently, demand for higher definition in mobile displays has been growing. Since a display using an organic electroluminescence device is a self-luminous type display, the display has characteristics of a wide viewing angle and low power consumption, and application of the display to mobile displays is expected.

As the organic electroluminescence device, for example, an organic electroluminescence device with a configuration in which a first electrode, an organic layer including a light-emitting layer, and a second electrode are laminated in order is known (for example, refer to Japanese Unexamined Patent Application Publication No. 2008-130363). The first electrode is provided separately for each device, and a partition wall configured of an insulating film is provided in a region between adjacent first electrodes. A driving device such as a transistor and a planarization layer covering the driving device are arranged below the first electrode, and the driving device and the first electrode are connected to each other through a connection hole provided in the planarization layer. The connection hole is located in a position overlapping the partition wall in a plan view, i.e., in a non-light emission region (for example, refer to Japanese Unexamined Patent Application Publication No. 2001-148291). In other words, a light emission region is arranged out of a region where the connection hole is formed, because a level difference caused by the connection hole affects light emission of the organic electroluminescence device.

SUMMARY

When the arrangement of the light emission region is limited by the position where the connection hole is formed in the above-described manner, a ratio of the light emission region to a pixel area is reduced, or the pixel area is increased to cause difficulty in achieving higher definition.

It is desirable to provide a display unit capable of arranging a light emission region more freely, a method of manufacturing the same, and an electronic apparatus.

According to an embodiment of the present technology, there is provided a display unit including: a drive wire; a planarization layer covering the drive wire and having a connection hole; a relay electrode provided on the planarization layer and configured to be electrically connected to the drive wire through the connection hole; a filling member made of an insulating material and provided in the connection hole; a first partition wall made of a same material as that of the filling member and covering an end of the relay electrode; a first electrode covering the filling member and configured to be electrically connected to the relay electrode; a second electrode facing the first electrode; and a functional layer located between the first electrode and the second electrode, the functional layer including a light-emitting layer.

According to an embodiment of the present technology, there is provided an electronic apparatus provided with the display unit, the display unit including: a drive wire; a planarization layer covering the drive wire and having a connection hole; a relay electrode provided on the planarization layer and configured to be electrically connected to the drive wire through the connection hole; a filling member made of an insulating material and provided in the connection hole; a first partition wall made of a same material as that of the filling member and covering an end of the relay electrode; a first electrode covering the filling member and configured to be electrically connected to the relay electrode; a second electrode facing the first electrode; and a functional layer located between the first electrode and the second electrode, the functional layer including a light-emitting layer.

In the display unit and the electronic apparatus according to the embodiments of the present technology, the filling member is provided in the connection hole of the planarization layer; therefore, a level difference caused by the connection hole is reduced. The first electrode, the functional layer, and the second electrode are laminated in a position covering the filling member.

According to an embodiment of the present technology, there is provided a method of manufacturing a display unit including: forming a drive wire; forming a planarization layer covering the drive wire, and then forming a connection hole in the planarization layer; forming a relay electrode on the planarization layer and configuring the relay electrode to be electrically connected to the drive wire through the connection hole; forming a filling member made of an insulating material in the connection hole and forming a first partition wall covering an end of the relay electrode with use of a same material as that of the filling member; forming a first electrode to cover the filling member and configuring the first electrode to be electrically connected to the relay electrode; and forming a functional layer including a light-emitting layer and a second electrode in this order on the first electrode.

In the method of manufacturing the display unit according to the embodiment of the present technology, the filling member made of the insulating material is formed in the connection hole; therefore, a level difference caused by the connection hole is reduced. A light emission region is formed by providing the first electrode, the functional layer, and the second electrode in this order on the filling member.

In the display unit, the method of manufacturing the display unit, and the electronic apparatus according to the embodiments of the present technology, the level difference caused by the connection hole is reduced; therefore, the light emission region is allowed to be provided in a position overlapping the connection hole in a plan view. Therefore, the light emission region is allowed to be arranged more freely. It is to be noted that effects of the embodiments of the present technology are not limited to effects described here, and may include any effect described in this description.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

FIG. 39 is a plan view illustrating a schematic configuration of a module including any of the display units illustrated in FIG. 1 and the like.

DETAILED DESCRIPTION

Some embodiments of the present technology will be described in detail below referring to the accompanying drawings. It is to be noted that description will be given in the following order.

1. First Embodiment (Display unit: Top emission type)
2. Modification Example 1 (Example in which a relay electrode has reflectivity)
3. Modification Example 2 (Example in which one relay electrode is connected to a drive wire through a plurality of connection holes)
4. Modification Example 3 (Example in which a partial region of the relay electrode configures one electrode of a retention capacitor device)
5. Modification Example 4 (Example in which an end of a first electrode is covered with a partition wall)
6. Modification Example 5 (Example including a reflecting member on a side surface of the partition wall)
7. Second Embodiment (Example in which a first electrode extends to a side surface of a partition wall)
8. Modification Example 6 (Example in which a filling member and the partition wall are integrally formed)
9. Modification Example 7 (Example in which an end of a first electrode is covered with the partition wall)

10. Third Embodiment (Example including a partition wall covering a part of a surface of a relay electrode)

11. Modification Example 8 (Example including a reflecting member on a side surface of the partition wall)

12. Modification Example 9 (Example in which an end of a first electrode is covered with the partition wall)

13. Fourth Embodiment (Example of bottom emission type)

First Embodiment

[Entire Configuration of Display Unit 1]

Figure 1:
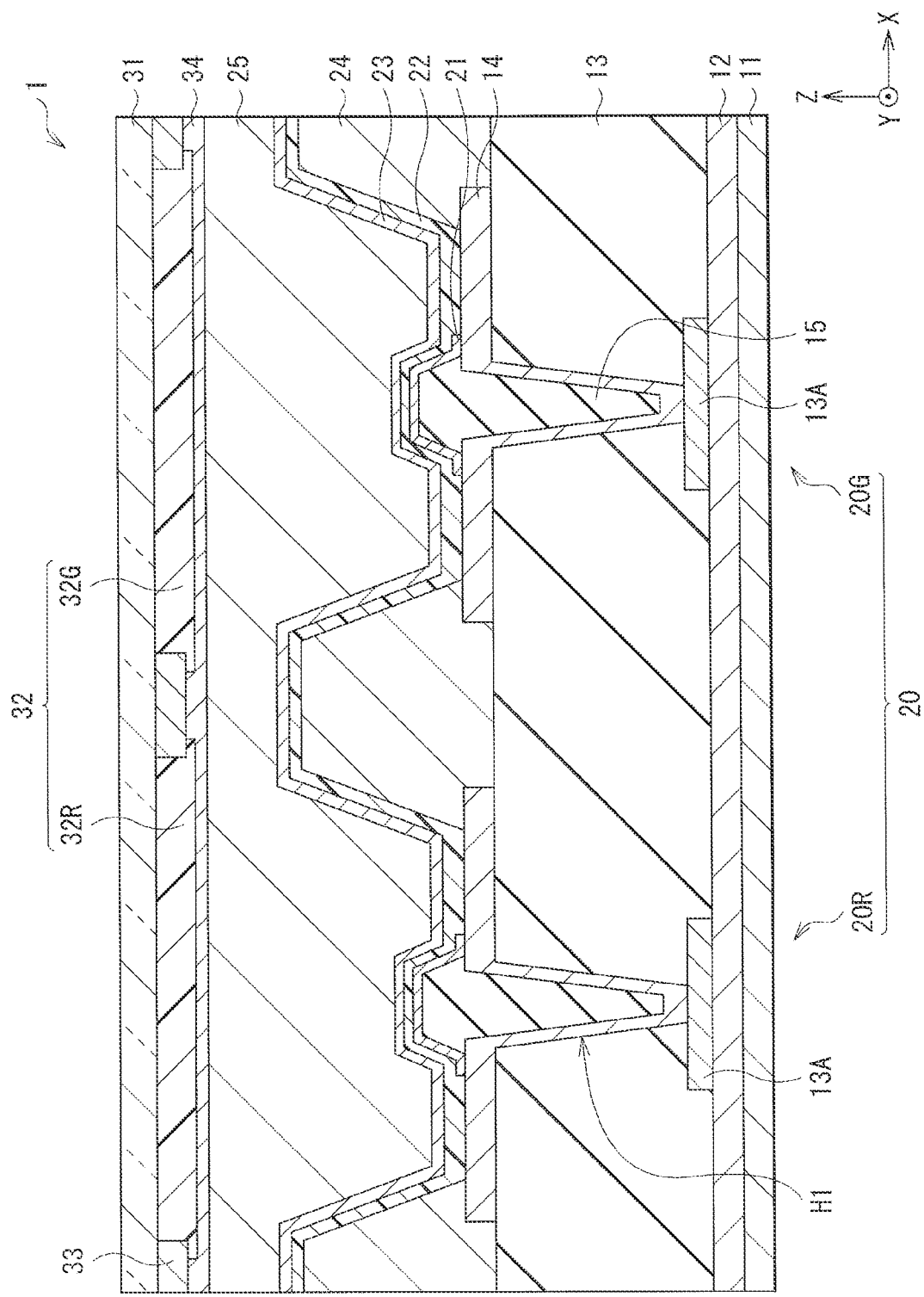
FIG. 1 is a sectional view illustrating a configuration of a display unit according to a first embodiment of the present technology.

FIG. 1 illustrates a sectional configuration of a main part of an organic EL display unit (a display unit 1) according to a first embodiment of the present technology. The display unit 1 includes a TFT layer 12 including transistors (a sampling transistor 44A and a driving transistor 44B in FIG. 3 that will be described later), a drive wire 13A, a planarization layer 13, a relay electrode 14, and organic light-emitting devices 20 in this order on a substrate 11. Each of the organic light-emitting devices 20 may be configured of, for example, any one of three sub-pixels (pixels PXLC in FIG. 2 that will be described later) of red (R), green (G), and blue (B), and a combination of these three sub-pixels functions as one pixel. FIG. 1 illustrates a red organic light-emitting device 20R configured to emit red light and a green organic light-emitting device 20G configured to emit green light, and a blue organic light-emitting device configured to emit blue light has a substantially same configuration as those of the red organic light-emitting device 20R and the green organic light-emitting device 20G. A partition wall 24 is provided between adjacent two of the organic light-emitting devices 20. Such organic light-emitting devices 20 and the partition wall 24 are covered with a sealing layer 25. A sealing substrate 31 faces the substrate 11 with the organic light-emitting devices 20 and the sealing layer 25 in between. The display unit 1 is a so-called top emission type display unit in which light emitted from the organic light-emitting devices 20 is extracted from the sealing substrate 31.

Figure 2:
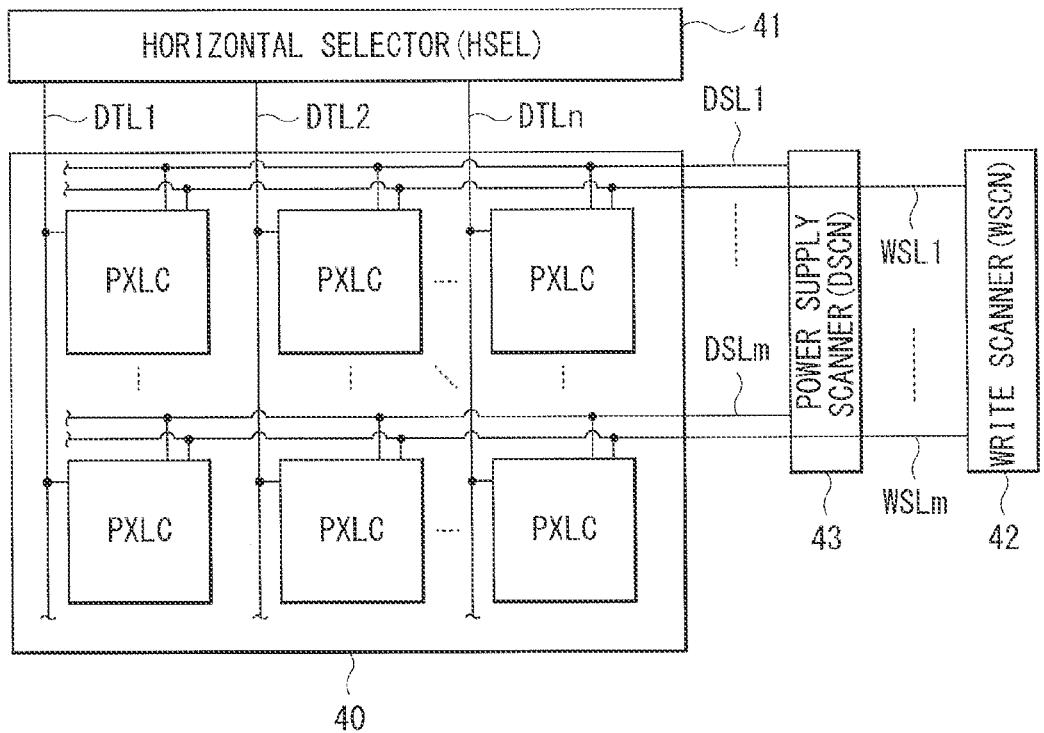
FIG. 2 is a diagram illustrating an entire configuration of the display unit illustrated in FIG. 1.

FIG. 2 illustrates an entire configuration of the display unit 1. As illustrated in FIG. 2, for example, a display region 40 in which a plurality of pixels PXLC (sub-pixels) each including the organic light-emitting device 20 (refer to FIG. 1) are arranged in a matrix form is formed on the substrate 11, and a horizontal selector (HSEL) 41 as a signal line drive circuit, a write scanner (WSCN) 42 as a scanning line drive circuit, and a power supply scanner (DSCN) as a power supply line drive circuit are provided around the display region 40.

In the display region 40, a plurality of (an integer n) signal lines DTL1 to DTLn are arranged along a column direction, and a plurality of (an integer m) scanning lines WSL1 to WSLm and power supply lines DSL1 to DSLm are arranged along a row direction. Moreover, each of the pixels PXLC (any one of pixels corresponding to R, G, and B) is arranged at an intersection of each signal line DTL and each scanning line WSL. Each of the signal lines TDL is connected to the horizontal selector 41, and an image signal is supplied from the horizontal selector 41 to each of the signal lines DTL. Each of the scanning lines WSL is connected to the write scanner 42, and a scanning signal (a selection pulse) is supplied from the write scanner 42 to each of the scanning lines WSL. Each of the power supply lines DTL is connected to the power supply scanner 43, and a power supply signal (a control pulse) is supplied from the power supply scanner 43 to each of the power supply lines DSL.

Figure 3:
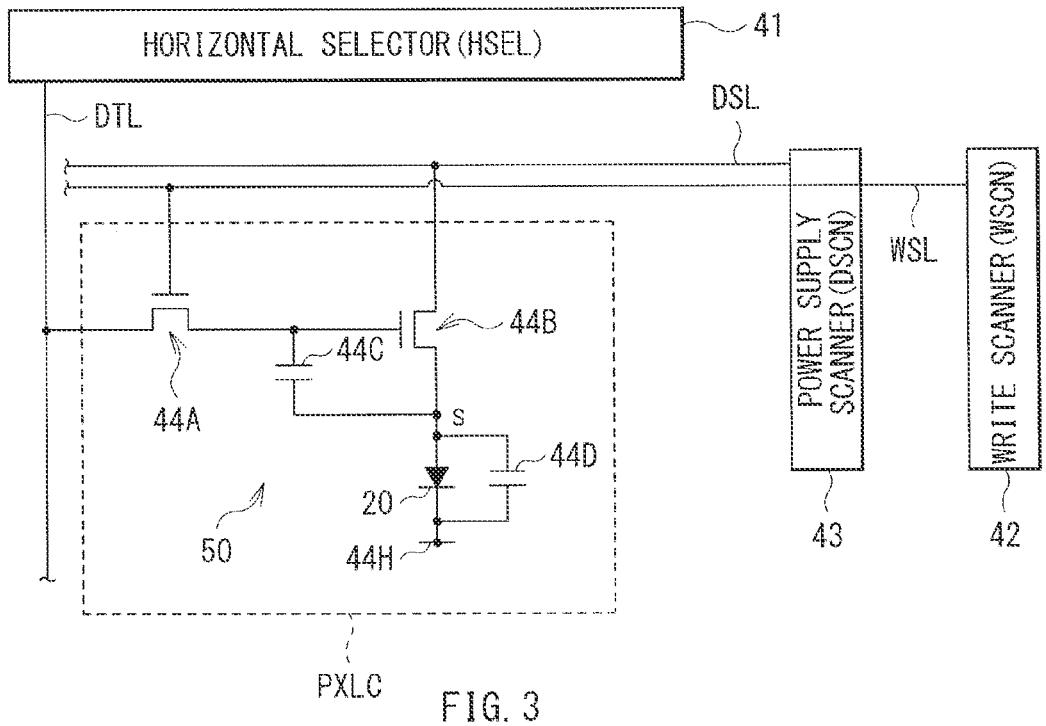
FIG. 3 is a diagram illustrating an example of a pixel drive circuit illustrated in FIG. 2.

FIG. 3 illustrates a specific circuit configuration example in the pixel PXLC. Each of the pixels PXLC includes a pixel circuit 50 including the organic light-emitting device 20. The pixel circuit 50 is an active type drive circuit including the sampling transistor 44A, the driving transistor 44B, a retention capacitor device 44C, an auxiliary capacitor device 44D, and the organic light-emitting device 20.

In the sampling transistor 44A, a gate thereof is connected to the scanning line WSL corresponding thereto, and one of a source and a drain thereof is connected to the signal line DTL corresponding thereto, and the other is connected to a gate of the driving transistor 44B. In the driving transistor 44B, a drain thereof is connected to the power supply line DSL corresponding thereto, and a source thereof is connected to an anode of the organic light-emitting device 20. Moreover, a cathode of the organic light-emitting device 20 is connected to a grounding wire 44H. It is to be noted that the grounding wire 44H is wired as a common wire to all of the pixels PXLC. The retention capacitor device 44C is arranged between the source and the gate of the driving transistor 44B. The auxiliary capacitor device 44D is arranged between the anode of the organic light-emitting device 20 (the source of the driving transistor 44B) and the grounding wire 44H.

The sampling transistor 44A is configured to sample a signal potential of an image signal supplied from the signal line DTL by being brought into conduction according to a scanning signal (a selection pulse) supplied from the scanning line WSL to store the signal potential in the retention capacitor device 44C. The driving transistor 44B is configured to receive supply of a current from the power supply line DSL that is set to a predetermined first potential (not illustrated) to supply a driving current to the organic light-emitting device 20 according to the signal potential stored in the retention capacitor device 44C. The organic light-emitting device 20 is configured to emit light with luminance according to the signal potential of the image signal by the drive current supplied from the driving transistor 44B. The retention capacitor device 44C has a role in compensating for a shortage of capacity of the organic light-emitting device 20 and increasing a writing gain of the image signal for the retention capacitor device 44.

[Main-Part Configuration of Display Unit 1]

Next, referring to FIG. 1 again, specific configurations of the substrate 11, the organic light-emitting device 20, the sealing substrate 31, and the like will be described below.

The substrate 11 may be formed of, for example, glass, a plastic material, or the like capable of blocking permeation of water (water vapor) and oxygen. The substrate 11 is a supporting body with one main surface where the organic light-emitting devices 20 are formed in an array. Examples of the material of the substrate 11 may include a glass substrate made of high strain point glass, soda glass ($Na_2 \cdot CaO \cdot SiO_2$), borosilicate glass ($Na_2O \cdot B_2O_3 \cdot SiO_2$), forsterite ($2MgO \cdot SiO_2$), lead glass ($Na_2O \cdot PbO \cdot SiO_2$), or the like, a quartz substrate, and a silicon substrate. The substrate 11 may be configured by providing an insulating film on a surface of such a glass substrate, such a quartz substrate, or such a silicon substrate. For the substrate 11, metal foil, or a film or a sheet made of a resin, or the like may be used. Examples of the resin may include organic polymers such as poly(methyl methacrylate) (PMMA), polyvinyl alcohol (PVA), polyvinyl phenol (PVP), polyether sulfone (PES), polyimide, polycarbonate, polyethylene terephthalate (PET), and polyethylene naphthalate (PEN). It is to be noted that, in the top emission type display unit, light is extracted from the sealing substrate 31; therefore, the substrate 11 may be formed of a permeable material or an impermeable material. For the sealing substrate 31, the same material as the material of the substrate 11 may be used, or a material different from the material of the substrate 11 may be used. Moreover, the substrate 11 may be made of a flexible material.

The TFT layer 12 includes the above-described sampling transistor 44A and the driving transistor 44B, and functions as an active device of the organic light-emitting device 20. The transistors of the TFT layer 12 may have an inverted stagger configuration (bottom gate type) or a stagger configuration (top gate type). The source of the driving transistor 44B is electrically connected to the drive wire 13A.

The planarization layer 13 is configured to planarize a surface where the TFT layer 12 and the drive wire 13A are formed of the substrate 11, and may be configured of, for example, an organic insulating film made of polyimide, an acrylic-based resin, a novolac-based resin, or the like. Alternatively, the planarization layer 13 may be configured of an inorganic insulating film, for example, a single-layer film or a laminate film including one or more kinds of silicon oxide ($SiO_x$), silicon nitride ($SiN_x$), silicon oxynitride (SiON), and the like.

A connection hole H1 is provided in the planarization layer 13. The relay electrode 14 on the planarization layer 13 and the drive wire 13A are electrically connected to each other through the connection hole HE The relay electrode 14 is provided between the drive wire 13A and the organic light-emitting device 20, and is configured to electrically connect the drive wire 13A and the organic light-emitting device 20 (more specifically, a first electrode 21 that will be described later) to each other. The relay electrode 14 is provided along a wall surface (a side surface and a bottom surface) of the connection hole H1 from a top of the planarization layer 13, and is in contact with the drive wire 13A on the bottom surface of the connection hole HE The relay electrode 14 is made of a conductive material with high reflectivity to light emitted from the organic light-emitting device 20. For example, an aluminum (Al)-neodymium (Nd) alloy with a thickness of about 200 nm may be used for the relay electrode 14. Light extraction efficiency to a front surface is allowed to be improved by using the light-reflective relay electrode 14.

In this embodiment, a filling member 15 is so provided to the connection hole H1 as to cover the relay electrode 14 in the connection hole HE As will be described in detail later, the filling member 15 is allowed to reduce a level difference caused by the connection hole H1 and to arrange a light emission region (a light emission region E in a part (B) in FIG. 4 that will be described later) in a position overlapping the connection hole H1 in a plan view.

The filling member 15 is configured to fill the connection hole H1, and is provided to the connection hole H1 and its neighborhood. A position (a position in a Z direction) of a surface of the filling member 15 may be preferably close to a position of a surface of the relay electrode 14 on the planarization layer 13. For example, the surface of the filling member 15 may be so provided as to protrude from the surface of the relay electrode 14 on the planarization layer 13, and may be provided in a position closer by about 1 μm or less to the sealing substrate 31 than the surface of the relay electrode 14 on the planarization layer 13. The surface of the filling member 15 may be dented more than the surface of the relay electrode 14 on the planarization layer 13, and may be provided in a position closer to the substrate 11 than the surface of the relay electrode 14 on the planarization layer 13. The filling member 15 may be configured of, for example, an organic insulating film made of polyimide, an acrylic-based resin, a novolac-based resin, or the like.

The organic light-emitting device 20 is provided in a region including a top of the filling member 15 in a plan view. The organic light-emitting device 20 includes the first electrode 21, an organic layer 22 including a light-emitting layer, and a second electrode 23 in this order from a position closer to the planarization layer 13 (the substrate 11).

The first electrode 21 is so provided as to cover the filling member 15, and is in contact with the relay electrode 14 around the connection hole H1. FIG. 4 illustrates a specific configuration in proximity to the connection hole H1, and a part (A) in FIG. 4 illustrates a sectional configuration, and a part (B) in FIG. 4 illustrates a planar configuration. In the connection hole H1, the relay electrode 14 and the first electrode 21 face each other with the filling member 15 in between (refer to the part (A) in FIG. 4), and the relay electrode 14, the filling member 15, and the first electrode 21 are provided in a position overlapping the connection hole H1 in a plan view (refer to the part (B) in FIG. 4). The first electrode 21 and the relay electrode 14 are provided separately for each of the organic light-emitting devices 20. The relay electrode 14 is provided throughout a wider area than that of the first electrode 21 in a plan view, and is widened around the first electrode 21 (refer to the part (B) in FIG. 4).

The first electrode 21 may have, for example, both a function as an anode electrode and a function as a reflective layer, and may be desirably made of a material with high reflectivity and a high hole injection property. For such a first electrode 21, for example, a conductive material with a thickness in a laminate direction (hereinafter simply referred to as "thickness") of about 100 nm to about 300 nm both inclusive may be used. The thickness of the first electrode 21 may be smaller than that of the relay electrode 14. Examples of the material of the first electrode 21 may include simple substances and alloys of metal elements such as chromium (Cr), gold (Au), platinum (Pt), nickel (Ni), copper (Cu), molybdenum (Mo), tungsten (W), titanium (Ti), tantalum (Ta), aluminum (Al), iron (Fe), and silver (Ag). The first electrode 21 may be configured of a laminate of a plurality of such metal films. For example, an Ag—Pd—Cu alloy prepared by containing about 0.3 wt % to about 1 wt % both inclusive of Pd and about 0.3 wt % to about 1 wt % both inclusive of Cu in silver, or an Al-neodymium (Nd) alloy may be used for the first electrode 21. Although a material with a large work function may be preferably used for the first electrode 21, even a metal with a small work function such as aluminum and an aluminum alloy may be used for the first electrode 21 by selecting an appropriate organic layer 22 (in particular, a hole injection layer that will be described later). The first electrode 21 may be made of a conductive material with high light transparency, and a reflective layer may be provided between the substrate 11 and the first electrode 21.

The partition wall 24 is provided between adjacent two of the first electrodes 21. The partition wall 24 is configured to cover an end of the relay electrode 14 on the planarization layer 13, and is provided between the relay electrode 14 and the organic layer 22 in an outer edge of the relay electrode 14. When such a partition wall 24 is provided, the adjacent organic light-emitting devices 20 are electrically isolated from each other, and insulation between the relay electrode 14 and the second electrode 23 is secured. In a region where the partition wall 24 is not provided, the surface of the first electrode 21 and the organic layer 22 or the surface of the relay electrode 14 and the organic layer 22 are in contact with each other. Each of a contact region between the first electrode 21 and the organic layer 22 and a contact region between the relay electrode 14 and the organic layer 22 serves as a light emission region (a light emission region E in the part (B) in FIG. 4). Thus, in the display unit 1, the shape of the light emission region E of the organic light-emitting device 20 is controlled by the partition wall 24. Moreover, the partition wall 24 covering the end of the relay electrode 14 has a role in preventing a short circuit between the relay electrode 14 and the second electrode 23 caused by the thickness of the relay electrode 14. The partition wall 24 may preferably have a tapered shape to enhance light extraction efficiency of the organic light-emitting device 20. The partition wall 24 is made of the same material as that of the filling member 15, and may be formed, for example, in a same process as a process of forming the filling member 15. A height (a distance in the Z direction) of the partition wall 24 is substantially the same as that of the filling member 15, and may be, for example, about 1 μm to about 5 μm both inclusive.

The organic layer 22 may be provided as a common layer for all of the organic light-emitting devices 20, and includes a hole injection layer, a hole transport layer, the light-emitting layer, an electron transport layer, and an electron injection layer (all not illustrated) in this order from a position closer to the first electrode 21. The organic layer 22 may be configured of the hole transport layer, the light-emitting layer, and the electron transport layer, and in this case, the light-emitting layer may also serve as the electron transport layer. The organic layer 22 may be configured by laminating a plurality of such laminate units (so-called tandem units) with a connection layer in between. For example, the organic layer 22 may include tandem units for respective colors of red, green, blue, and white, and may be configured by laminating the tandem units. The thickness of the organic layer 22 may be, for example, about 100 nm to about 300 nm both inclusive.

The hole injection layer is a buffer layer to enhance hole injection efficiency and to prevent leakage. The hole injection layer may have, for example, a thickness of about 1 nm to about 300 nm both inclusive, and may be made of, for example, a hexaazatriphenylene derivative represented by Chem. 1 or Chem. 2.

[Chem. 1]

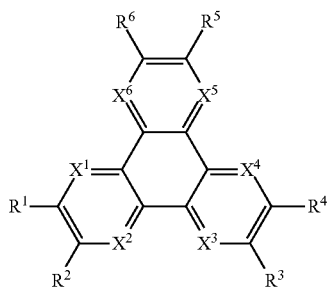

where $R^1$ to $R^6$ each are independently a substituted group selected from a group configured of hydrogen, a halogen, a hydroxyl group, an amino group, an arylamine group, a substituted or unsubstituted carbonyl group with 20 or less carbon atoms, a substituted or unsubstituted carbonyl ester group with 20 or less carbon atoms, a substituted or unsubstituted alkyl group with 20 or less carbon atoms, a substituted or unsubstituted alkenyl group with 20 or less carbon atoms, a substituted or unsubstituted alkoxyl group with 20 or less carbon atoms, a substituted or unsubstituted aryl group with 30 or less carbon atoms, a substituted or unsubstituted heterocyclic group with 30 or less carbon atoms, a nitrile group, a cyano group, a nitro group, and a silyl group, and adjacent groups $R^m$, where m=1 to 6, may be joined together through a cyclic structure, and $X^1$ to $X^6$ each are independently a carbon atom or a nitrogen atom.

[Chem. 2]

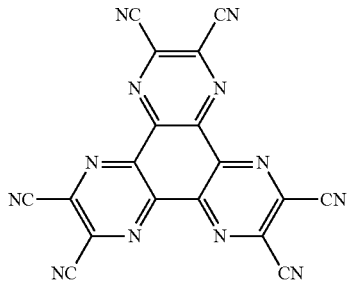

The hole transport layer is configured to enhance hole transport efficiency to the light-emitting layer. For example, the hole transport layer may have a thickness of about 40 nm, and may be made of 4,4',4''-tris(3-methylphenylphenylamino)triphenylamine (m-MTDATA) or α-naphthyl phenyl diamine (αNPD).

The light-emitting layer is a light-emitting layer for white light emission, and may have, for example, a laminate body of a red light-emitting layer, a green light-emitting layer, and a blue light-emitting layer between the first electrode 21 and the second electrode 23 and between the relay electrode 14 and the second electrode 23. The red light-emitting layer, the green light-emitting layer, and the blue light-emitting layer emit red light, green light, and blue light, respectively by the recombination of some of holes injected from the first electrode 21 through the hole injection layer and the hole transport layer and some of electrons injected from the second electrode 23 through the electron injection layer and the electron transport layer in response to the application of an electric field.

The red light-emitting layer may include, for example, one or more kinds selected from a red light-emitting material, a hole transport material, an electron transport material, a both-charge transport material. The red light-emitting material may be a fluorescent material or a phosphorescent material. The red light-emitting layer may have, for example, a thickness of about 5 nm, and may be made of 4,4'-bis(2,2-diphenylvinyl)biphenyl (DPVBi) mixed with about 30 wt % of 2,6-bis[(4'-methoxydiphenylamino)styryl]-1,5-dicyanonaphthalene (BSN).

The green light-emitting layer may include, for example, one or more kinds selected from a green light-emitting material, a hole transport material, an electron transport material, and a both-charge transport material. The green light-emitting material may be a fluorescent material or a phosphorescent material. For example, the green light-emitting layer may have a thickness of about 10 nm, and may be made of DPVBi mixed with about 5 wt % of Coumarin6.

The blue light-emitting layer may include, for example, one or more kinds selected from a blue light-emitting material, a hole transport material, an electron transport material, and a both-charge transport material. The blue light-emitting material may be a fluorescent material or a phosphorescent material. For example, the blue light-emitting layer may have a thickness of about 30 nm, and may be made of DPVBi mixed with about 2.5 wt % of 4,4'-bis[2{-4-(N,N-diphenylamino)phenyl}vinyl]biphenyl (DPAVBi).

The electron transport layer is configured to enhance electron transport efficiency to the light-emitting layer. For example, the electron transport layer may be made of tris(8-hydroxyquinoline) aluminum (Alq3) with a thickness of about 20 nm. The electron injection layer is configured to enhance electron injection efficiency to the light-emitting layer. The electron injection layer may be made of, for example, LiF, $Li_2O$, or the like.

The second electrode 23 is paired with the first electrode 21 and the relay electrode 14 with the organic layer 22 in between, and is provided as a common electrode for all of the organic light-emitting devices 20. The second electrode 23 may have, for example, both a function as a cathode electrode and a function as a light-transmissive layer, and may be desirably made of a material with high electrical conductivity and high light transmittance. Therefore, the second electrode 23 may be made of, for example, an alloy of aluminum (Al), magnesium (Mg), silver (Ag), calcium (Ca), or sodium (Na). In particular, an alloy of magnesium and silver (a Mg—Ag alloy) may be preferable, because the Mg—Ag alloy has both electrical conductivity and small absorption in a thin film. Although a ratio of magnesium to silver in the Mg—Ag alloy is not specifically limited, the ratio may be preferably within a range of Mg:Ag=about 20:1 to about 1:1 both inclusive in film thickness ratio. Alternatively, as the material of the second electrode 23, an alloy of aluminum (Al) and lithium (Li) (an Al—Li alloy) may be used, and indium tin oxide (ITO), zinc oxide (ZnO), alumina-doped zinc oxide (AZO), gallium-doped zinc oxide (GZO), indium zinc oxide (IZO), indium titanium oxide (ITiO), indium tungsten oxide (IWO), or the like may be used. The second electrode 23 may be configured by laminating a plurality of films. For example, a film made of magnesium, silver, or an alloy of magnesium or silver may be laminated on a film made of calcium, barium (Ba), lithium, cesium (Cs), indium (In), magnesium, silver, or the like to configure the second electrode 23. A thickness of the second electrode 23 may be, for example, about 50 nm to about 500 nm both inclusive.

A high-resistance layer (not illustrated) may be provided between the organic layer 22 and the second electrode 23. The high-resistance layer is configured to prevent the occurrence of a short circuit between the first electrode 21 and the relay electrode 14, and the second electrode 23, and is provided as a common layer for all of the organic light-emitting devices 20. The high-resistance layer has higher electrical resistance than the first electrode 21 and the second electrode 23, and has a charge transport function or a charge injection function. In a case where a particle (a foreign matter) or a protrusion is unintentionally adhered to the first electrode 21 and the organic layer 22 is formed in this state, a short circuit may be caused by contact between the first electrode 21 and the second electrode 23. Such contact between the first electrode 21 and the second electrode 23 is allowed to be prevented by the high-resistance layer.

The high-resistance layer may be preferably made of, for example, a material with electrical resistivity of about $1\times10^6$ Ω·m to about $1\times10^8$ Ω·m both inclusive, because within this range, the occurrence of a short circuit is allowed to be sufficiently prevented, and a drive voltage is allowed to be kept low. The high-resistance layer may be made of, for example, niobium oxide ($Nb_2O_5$), titanium oxide ($TiO_2$), molybdenum oxide ($MoO_2$, $MoO_3$), tantalum oxide ($Ta_2O_5$), hafnium oxide (HfO), magnesium oxide (MgO), IGZO (InGaZnO$_x$), a mixture of niobium oxide and titanium oxide, a mixture of titanium oxide and zinc oxide (ZnO), a mixture of silicon oxide ($SiO_2$) and tin oxide ($SnO_2$), or a mixture prepared by mixing zinc oxide with one or more of magnesium oxide, silicon oxide, and aluminum oxide ($Al_2O_3$). The high-resistance layer may be configured by appropriately combining some of these materials. A high-resistance layer with a refractive index close to refractive indices of the organic layer 22 and the second electrode 23, for example, a refractive index of about 1.7 or more may be preferably used, and the refractive index of the high-resistance layer may be more preferably about 1.9 or more. Thus, external quantum efficiency of the light-emitting layer of the organic layer 22 is allowed to be improved. A thickness of the high-resistance layer may be, for example, about 100 nm to about 1000 nm both inclusive.

A protective layer (not illustrated) is provided on the second electrode 23. The protective layer is configured to prevent entry of water into the organic layer 22 and to enhance mechanical strength of the display unit 1. The protective layer is made of a material with high light transparency and low water permeability, and a thickness of the protective layer may be, for example, about 5 μm to about 15 μm both inclusive. For the protective layer, one of an insulating material and a conductive material may be used. For the protective layer, for example, silicon nitride ($SiN_X$), silicon oxide ($SiO_X$), aluminum oxide ($AlO_X$), or a combination thereof may be used. The sealing substrate 31 is bonded to the protective layer with the sealing layer 25 in between. The sealing layer 25 may be made of, for example, a thermosetting resin, an ultraviolet curable resin, or the like.

The sealing substrate 31 is configured to seal the respective organic light-emitting devices 20 together with the protective layer, and may be made of, for example, a material transparent to red light, green light, and blue light, for example, glass. A color filter 32 and a light-shielding layer 33 are provided on a surface facing the substrate 11 of the sealing substrate 31, and are covered with an overcoat layer 34.

The color filter 32 may include, for example, a red filter 32R, a green filter 32G, and a blue filter (all not illustrated) that are arranged corresponding to each pattern of the light-shielding layer 33 and the organic light-emitting device 20. The color filter 32 may be provided in a position overlapping the light-shielding layer 33. Each of the red filter 32R, the green filter 32G, and the blue filter may be made of, for example, a resin mixed with a pigment or a dye. Each of the red filter 32R, the green filter 32G, and the blue filter is adjusted by selecting the pigment or the dye to have high light transmittance in a target wavelength range of red, green, or blue. The light transmittance of the color filter 32 is low in a wavelength range out of the target wavelength range. A thickness of the color filter 32 may be, for example, about 1 μm to about 4 μm both inclusive. The color filter 32 may be provided on a surface opposite to the surface facing the substrate 11 of the sealing substrate 31; however, the color filter 32 may be preferably provided on the surface facing the substrate 11 of the sealing substrate 31, because the color filter 32 is not exposed to a surface, and is allowed to be protected by the sealing layer 25 or the like. Moreover, since a distance between the light-emitting layer 22 and the color filter layer 32 is narrowed, light emitted from the organic layer 22 is allowed to be prevented from entering an adjacent color filter of another color to cause color mixing.

The light-shielding layer 33 is a so-called black matrix (BM). The light-shielding layer 33 may be patterned in, for example, a matrix form according to the arrangement of the pixels PXLC in the display region 40 (refer to FIG. 2). The light-shielding layer 33 may be made of, for example, carbon black. A material having a light-shielding property and electrical conductivity, chromium, graphite, and the like may be used for the light-shielding layer 33. Alternatively, the light-shielding layer 33 may be configured of a thin-film filter using an interference of a thin film. The thin film filter may be configured to attenuate light, for example, by laminating one or more thin films made of a metal, a metal nitride, a metal oxide, or the like to cause an interference of the thin films. Examples of such a thin film filter may include a thin film filter including a laminate of silicon nitride (SiN) with a thickness of about 65 nm, amorphous silicon (a-Si) with a thickness of about 20 nm, and molybdenum (Mo) with a thickness of about 50 nm or more in this order from a position closer to the sealing substrate 31 or a thin film filter including a laminate of molybdenum oxide ($MoO_x$) with a thickness of about 45 nm, molybdenum with a thickness of about 10 nm, molybdenum oxide with a thickness of about 40 nm, and molybdenum (Mo) with a thickness of 50 nm or more in this order from a position closer to the sealing substrate 31.

The overcoat layer 34 is a coating agent for enhancing flatness of a surface of the color filter 32 and protecting the surface of the color filter 32, and may be made of, for example, an organic material such as a resin or an inorganic material such as SiO, SiN, or ITO.

[Manufacturing Method]

For example, the above-described display unit 1 may be manufactured by the following processes (refer to FIGS. 5A to 6B).

(Process of Forming TFT Layer and Planarization Layer)

First, after a drive circuit including the TFT layer 12 and the drive wire 13A are formed on the substrate 11 by a predetermined thin film process, the planarization layer 13 is formed on an entire surface of the substrate 11 by, for example, a spin coating method or a slit coating method. Next, the formed planarization layer 13 is patterned in a predetermined shape by, for example, a photolithography method to form the connection hole H1 in the planarization layer 13 (refer to FIG. 5A).

(Process of Forming Relay Electrode)

Figure 5A:
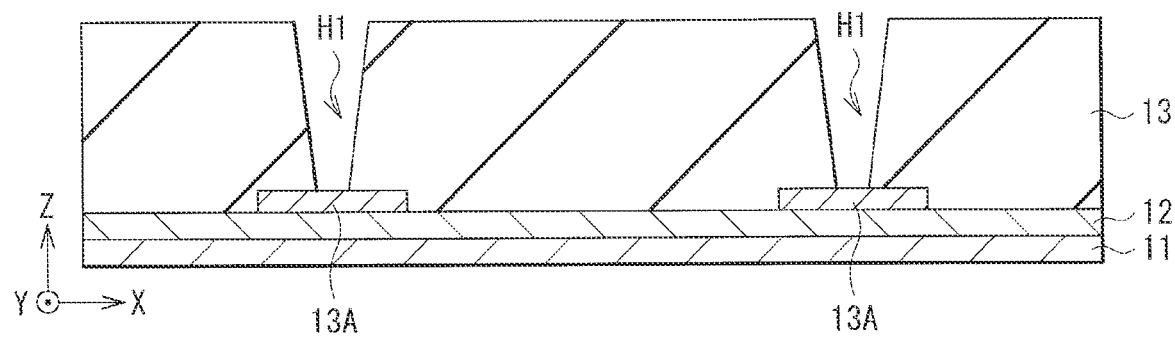
FIG. 5A is a sectional view illustrating a process of manufacturing the display unit illustrated in FIG. 1.
Figure 5B:
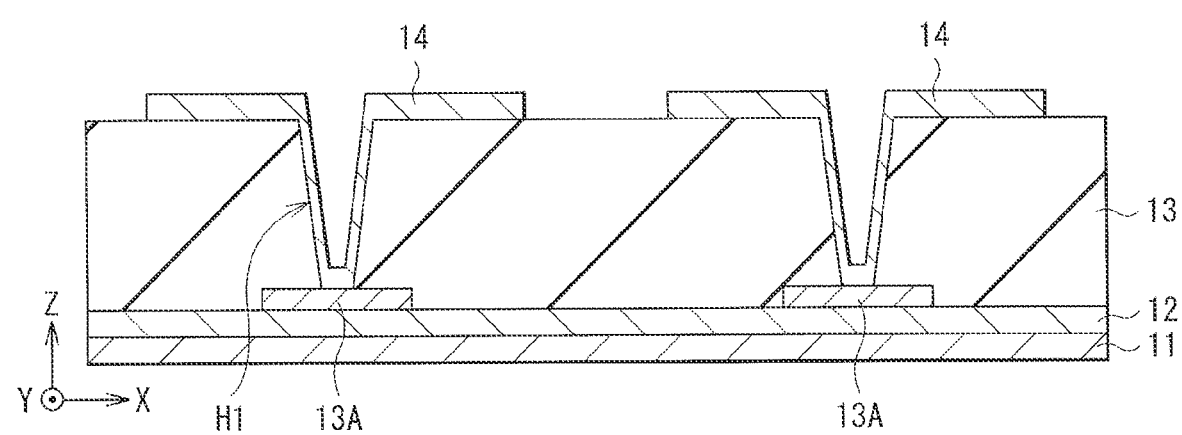
FIG. 5B is a sectional view illustrating a process following FIG. 5A.

Next, after, for example, a film of an Al—Nd alloy is formed on the planarization layer 13 on the entire surface of the substrate 11 with use of a sputtering method, the film is patterned with use of a photolithography method to form the relay electrode 14 (refer to FIG. 5B). At this time, the relay electrode 14 is configured to be electrically connected to the drive wire 13A through the connection hole H1 of the planarization layer 13.

(Process of Forming Filling Member and Partition Wall)

Figure 5C:
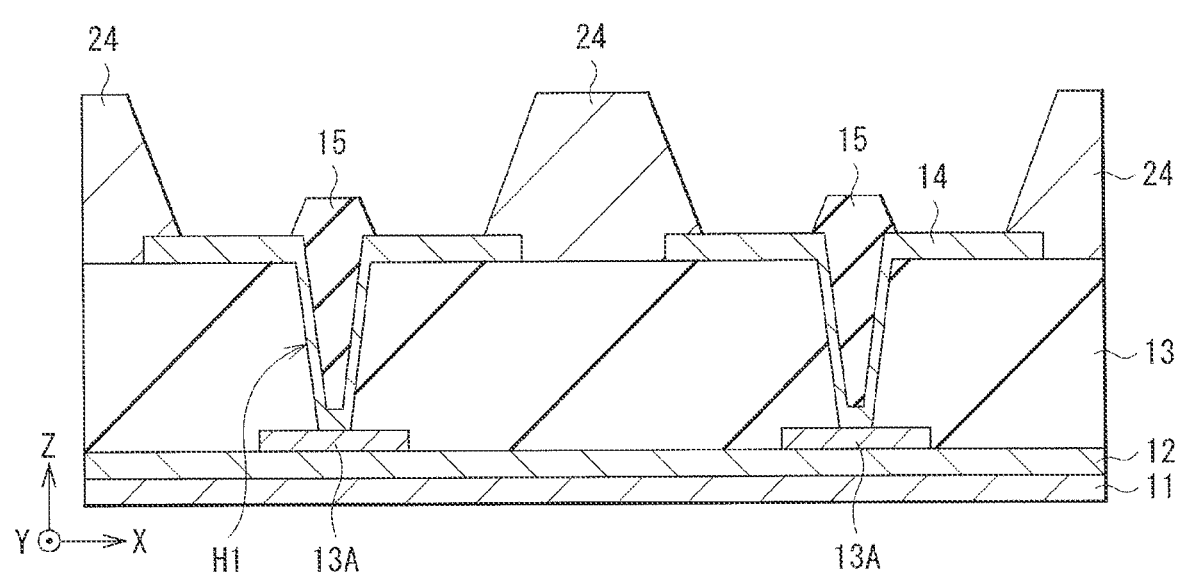
FIG. 5C is a sectional view illustrating a process following FIG. 5B.

After the relay electrode 14 is provided, as illustrated in FIG. 5C, the filling member 15 is formed in the connection hole H1, and the partition wall 24 is formed on the planarization layer 13. More specifically, first, for example, a film of photosensitive resin material is formed in the connection hole H1 and on the planarization layer 13 and the relay electrode 14 by a spin coating method. Next, after the film is exposed to light with use of a predetermined photo mask, the film is developed, and then is patterned with use of a wet etching method. Accordingly, the filling member 15 and the partition wall 24 are formed in a same process. The connection hole H1 of the planarization layer 13 is filled by forming the filling member 15 to reduce a level difference caused by the connection hole HE The filling member 15 and the partition wall 24 have a tapered shape by using the wet etching method to form the filling member 15 and the partition wall 24.

(Process of Forming Organic Light-emitting Device)

Figure 6A:
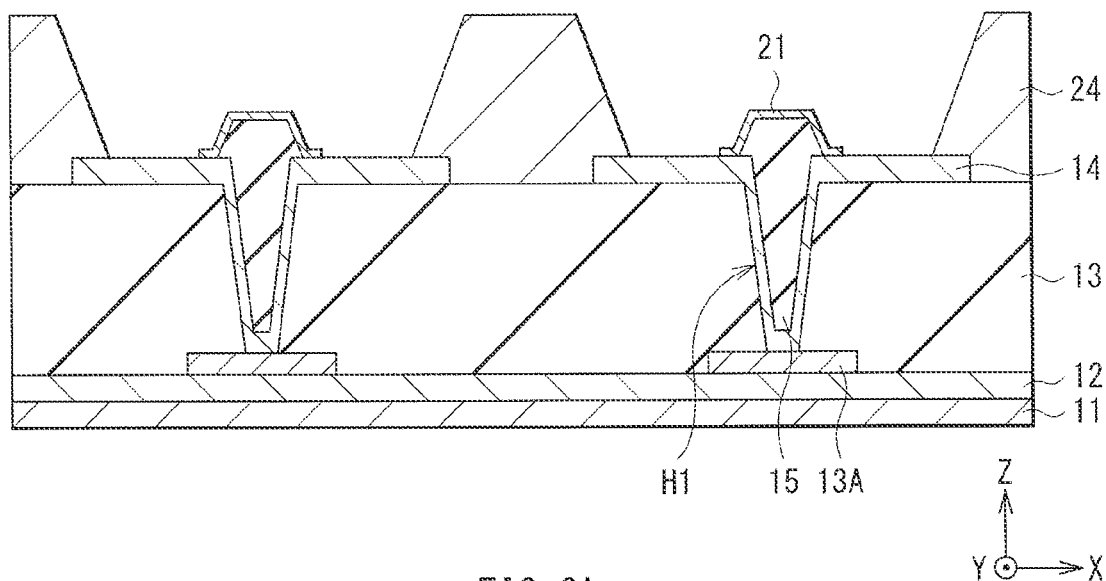
FIG. 6A is a sectional view illustrating a process following FIG. 5C.
Figure 6B:
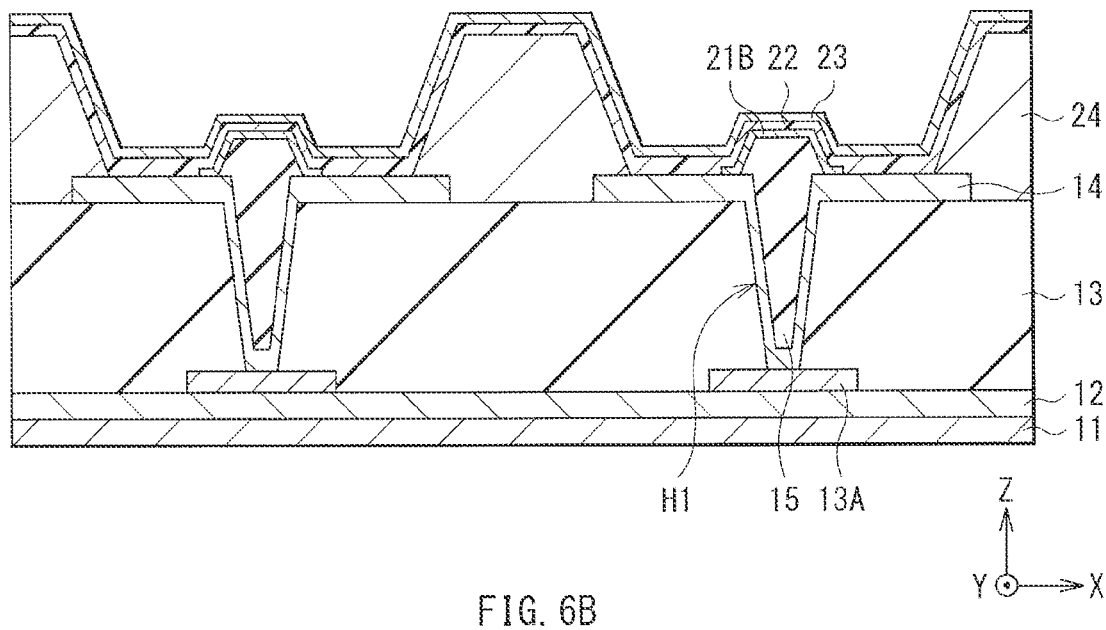
FIG. 6B is a sectional view illustrating a process following FIG. 6A.

Next, as illustrated in FIG. 6A, the first electrode 21 is formed from a top of the filing member 15 to a top of the relay electrode 14. The first electrode 21 is formed by forming a film of, for example, an AlNd alloy on the entire surface of the substrate 11 by a sputtering method, and then patterning the film with use of, for example, a photolithography method. At this time, the first electrode 21 is configured to be electrically connected to the relay electrode 14 by forming the first electrode 21 in contact with the relay electrode 14. After that, the organic layer 22 including the light-emitting layer and the second electrode 23 are formed in the entire display region 40 on the substrate 11 by, for example, a physical vapor deposition (PVD) method such as a vacuum deposition method (refer to FIG. 6B). The organic layer 22 and the second electrode 23 may be formed by a printing method such as a screen printing method and an ink jet printing method, a laser transfer method, a coating method, or the like.

(Process of Forming Sealing Substrate)

The light-shielding layer 33, the color filter 32, and the overcoat layer 34 are formed on the sealing substrate 31 by, for example, the following process. First, after a film made of the material of the light-shielding layer 33 is formed on the entire surface of the sealing substrate 31, the film is patterned in a matrix form with use of, for example, a photolithography process to form a plurality of openings according to the arrangement of the pixels PXLC. Accordingly, the light-shielding layer 33 is formed. Next, the red filters 32R, the green filters 32G, and the blue filters are sequentially provided to the openings of the light-shielding layer 33 by patterning to form the color filter 32. After that, the overcoat layer 34 is formed on the entire surface of the sealing substrate 31 where the color filter 32 is provided.

(Process of Bonding Substrate and Sealing Substrate)

The sealing substrate 31 formed as described above is bonded to the substrate 11 with the organic light-emitting devices 20 and the sealing layer 25 in between by, for example, an ODF (One Drop Fill) process. Thus, the display unit 1 illustrated in FIG. 1 is completed.

[Operation of Display Unit 1]

In the display unit 1, a drive current according to an image signal of each color is applied to each of the organic light-emitting devices 20, electrons and holes are injected into the organic layer 22 through the first electrode 21 and the second electrode 23 or through the relay electrode 14 and the second electrode 23. These electrons and these holes are recombined in the light-emitting layer included in the organic layer 22 to cause light emission. The light is reflected by the first electrode 21 and the relay electrode 14, and passes through the second electrode 23, the color filter 32, and the sealing substrate 31 to be extracted to outside. Thus, in the display unit 1, for example, a full-color image of R, G, and B is displayed. Moreover, a charge corresponding to the image signal is stored in the retention capacitor device 44C (refer to FIG. 3) by applying a potential corresponding to the image signal to an end of the retention capacitor device 44C during the image display operation.

Figure 4:
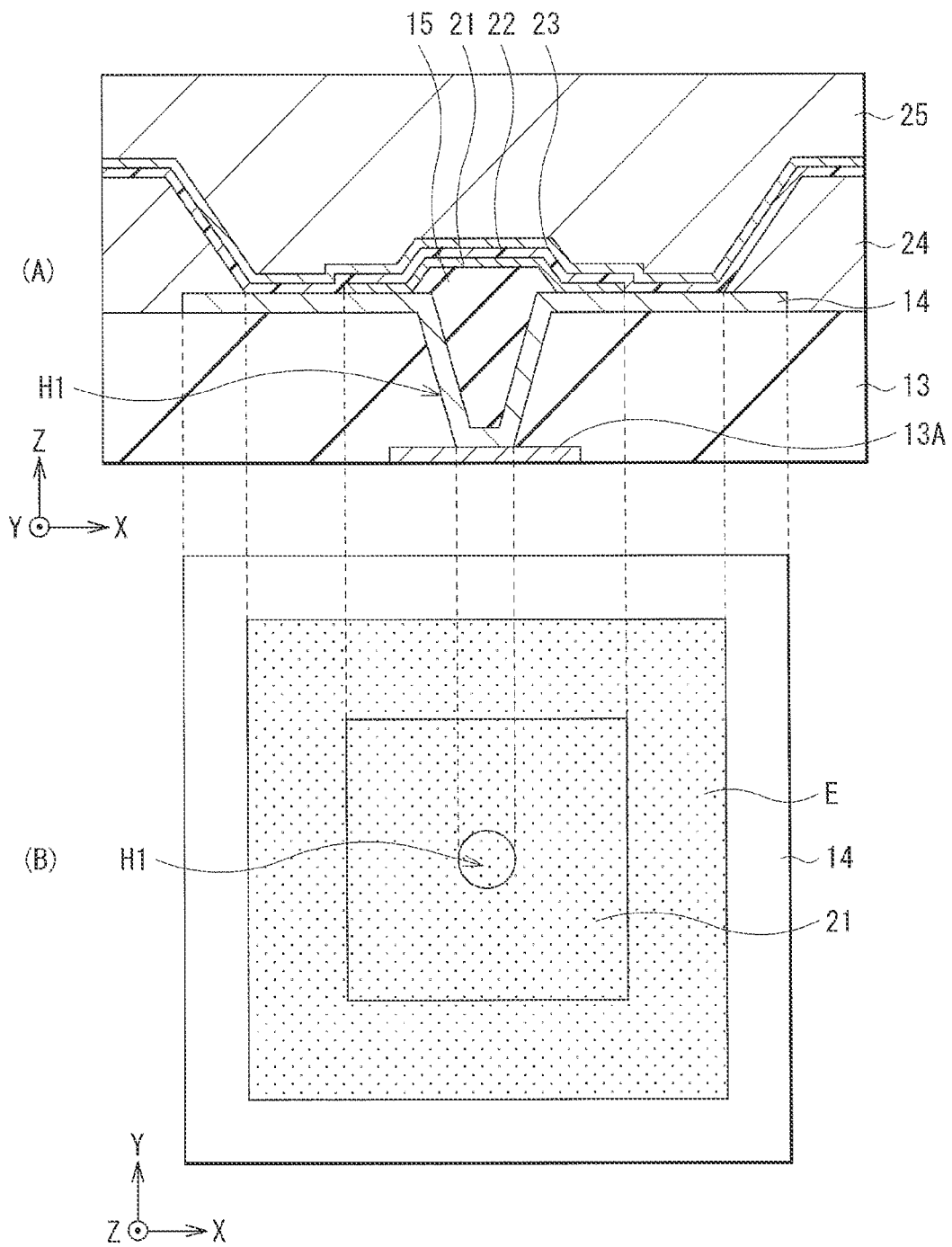
FIG. 4 is a diagram illustrating a light emission region of an organic light-emitting device illustrated in FIG. 1.

In this case, in the display unit 1, since the filling member 15 is provided in the connection hole H1 of the planarization layer 13, a level difference caused by the connection hole H1 is reduced, and the light emission region E (refer to the part (B) in FIG. 4) is allowed to be formed in a position overlapping the connection hole H1 in a plan view. This will be described below.

COMPARATIVE EXAMPLES

Figure 7:
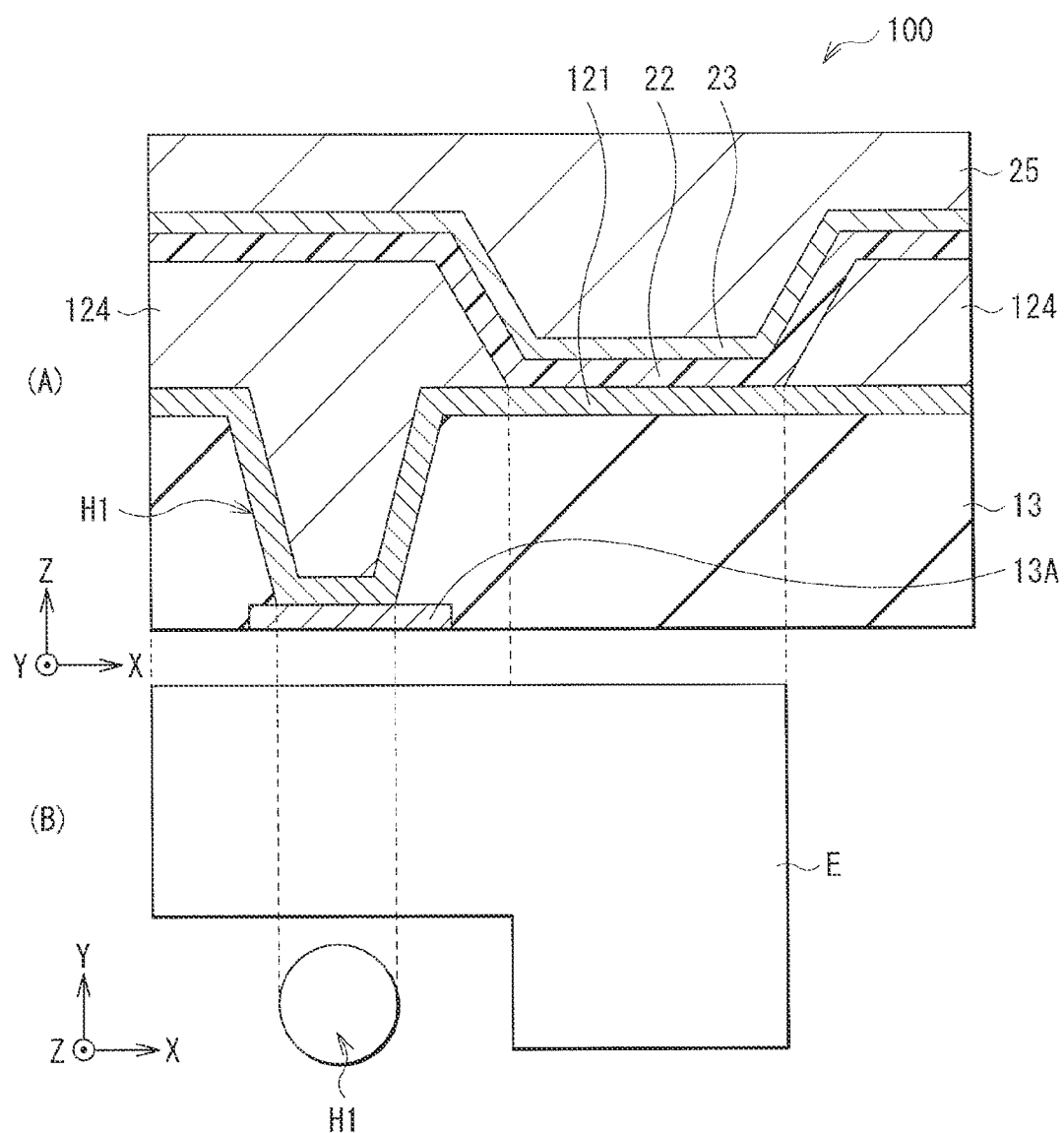
FIG. 7 is a diagram illustrating a configuration of a display unit according to Comparative Example 1.

FIG. 7 illustrates a configuration of a main part of a display unit (a display unit 100) according to Comparative Example 1. A part (A) in FIG. 7 illustrates a sectional configuration of the display unit 100, and a part (B) in FIG. 7 illustrates a planar configuration of the display unit 100. In the display unit 100, the relay electrode is not provided, and a first electrode (a first electrode 121) is connected to the drive wire 13A through the connection hole H1 of the planarization layer 13. A partition wall (a partition wall 124) is provided directly above the connection hole H1, and in a region overlapping the connection hole H1 in a plan view, the first electrode 121 and the organic layer 22 are electrically isolated from each other. In other words, a region overlapping the connection hole H1 in a plan view is a non-light emission region, and the light emission region E is so arranged as to avoid the position of the connection hole H1.

Figure 8:
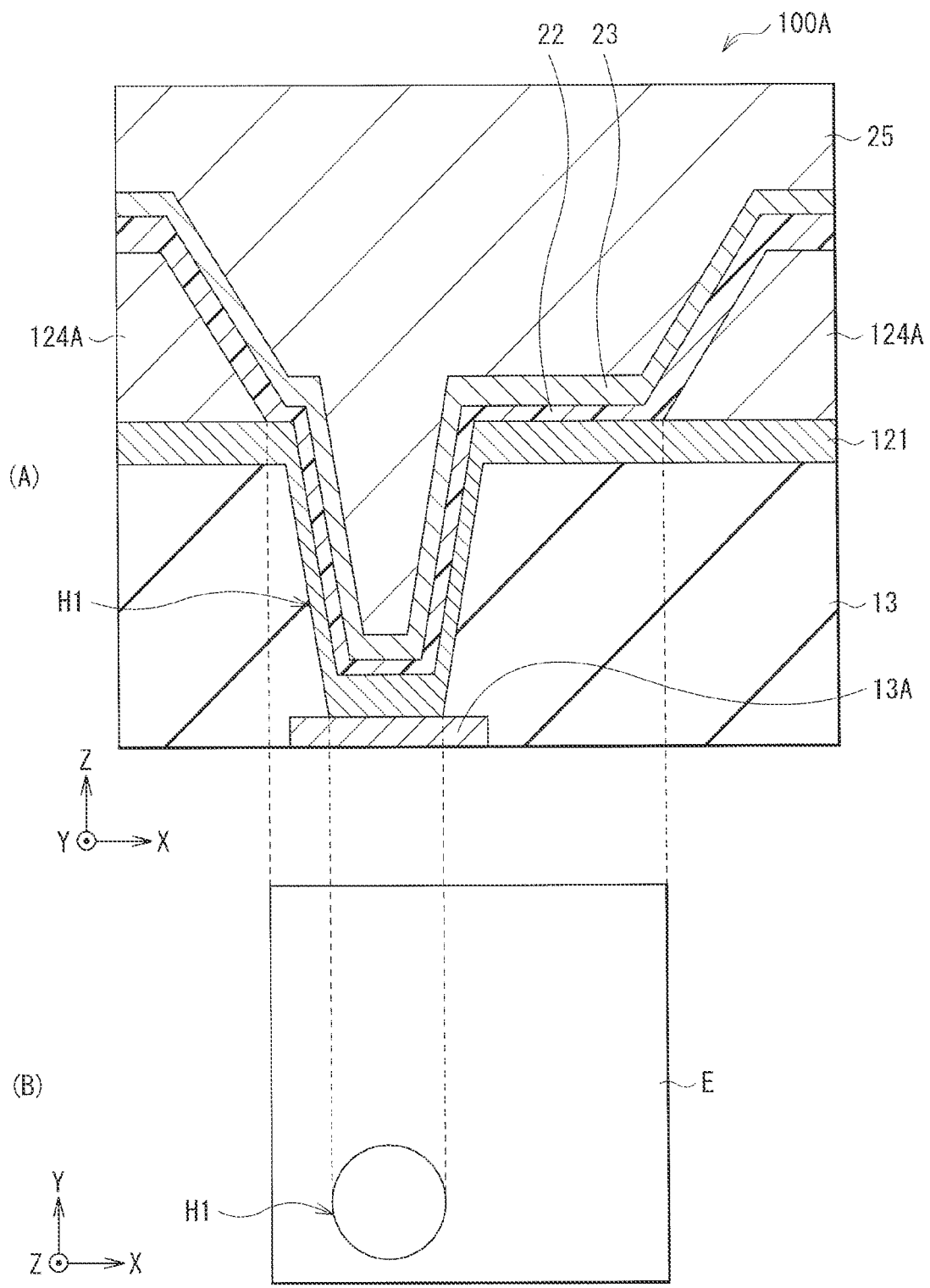
FIG. 8 is a diagram illustrating a configuration of a display unit according to Comparative Example 2.
Figure 9:
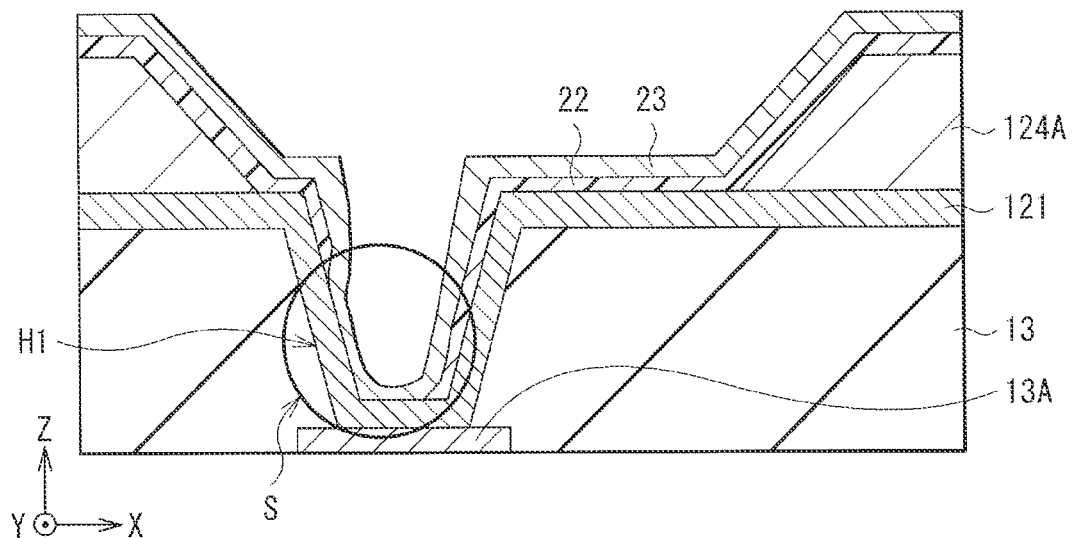
FIG. 9 is a sectional view illustrating a specific configuration in a neighborhood of a connection hole illustrated in FIG. 8.

FIG. 8 illustrates a configuration of a display unit (a display unit 100A according to Comparative Example 2) in which the light emission region E is formed even in the region overlapping the connection hole H1 in a plan view. A part (A) in FIG. 8 illustrates a sectional configuration of the display unit 100A, and a part (B) in FIG. 8 illustrates a planar configuration of the display unit 100A. When the first electrode 121, the organic layer 22, and the second electrode 23 are formed without forming the partition wall (a partition wall 124A) on the connection hole H1 in such a manner, as illustrated in FIG. 9, a short circuit (a short-circuited section S) between the first electrode 121 and the second electrode 23 may be caused by a level difference by the connection hole H1, thereby not emitting light properly. More specifically, it is difficult to form the organic layer 22 with a uniform thickness on a wall surface of the connection hole H1 with a steep slope, thereby parting the organic layer 22. The short circuit between the first electrode 121 and the second electrode 23 occurs in a portion where the organic layer 22 is parted. In particular, in a case where the organic layer 22 is formed by an evaporation method, the first electrode 121 and the second electrode 23 are easily short-circuited at the connection hole H1.

On the other hand, in the display unit 1, since the filling member 15 is provided in the connection hole H1 of the planarization layer 13, the wall surface of the connection hole H1 is covered with the filling member 15 to reduce the level difference caused by the connection hole H1. Therefore, the organic layer 22 is easily formed with a predetermined thickness in a position overlapping the connection hole H1 in a plan view. The first electrode 21 provided in a position covering the filling member 15 is configured to be electrically connected to the drive wire 13A through the relay electrode 14, and the organic layer 22 and the second electrode 23 are provided on the first electrode 21; therefore, light is emitted from above the connection hole HE In other words, a region overlapping the connection hole H1 in a plan view serves as the light emission region E.

Thus, the light emission region E is allowed to be arranged freely irrespective of the position of the connection hole H1; therefore, in the display unit 1, higher definition is achievable by reducing an area of a pixel region. Moreover, a ratio of the light emission region E to the pixel region is allowed to be increased. This will be described below.

Figure 10:
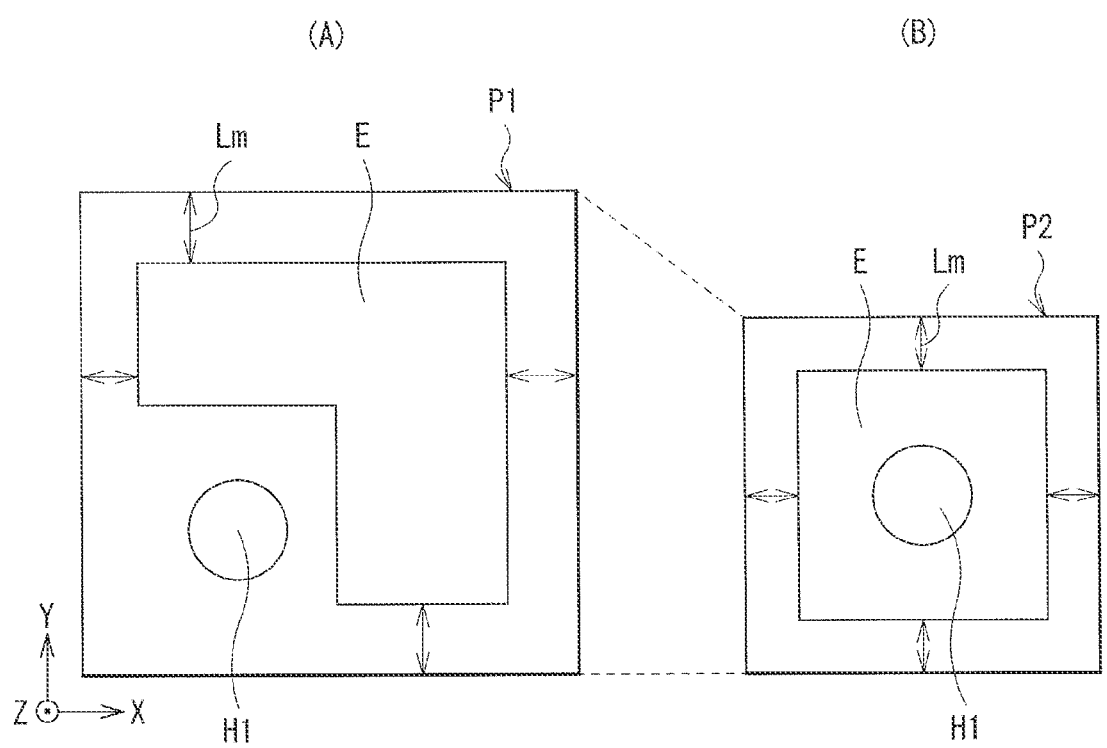
FIG. 10 is a diagram for describing a pixel region of the display unit illustrated in FIG. 1.
Figure 11:
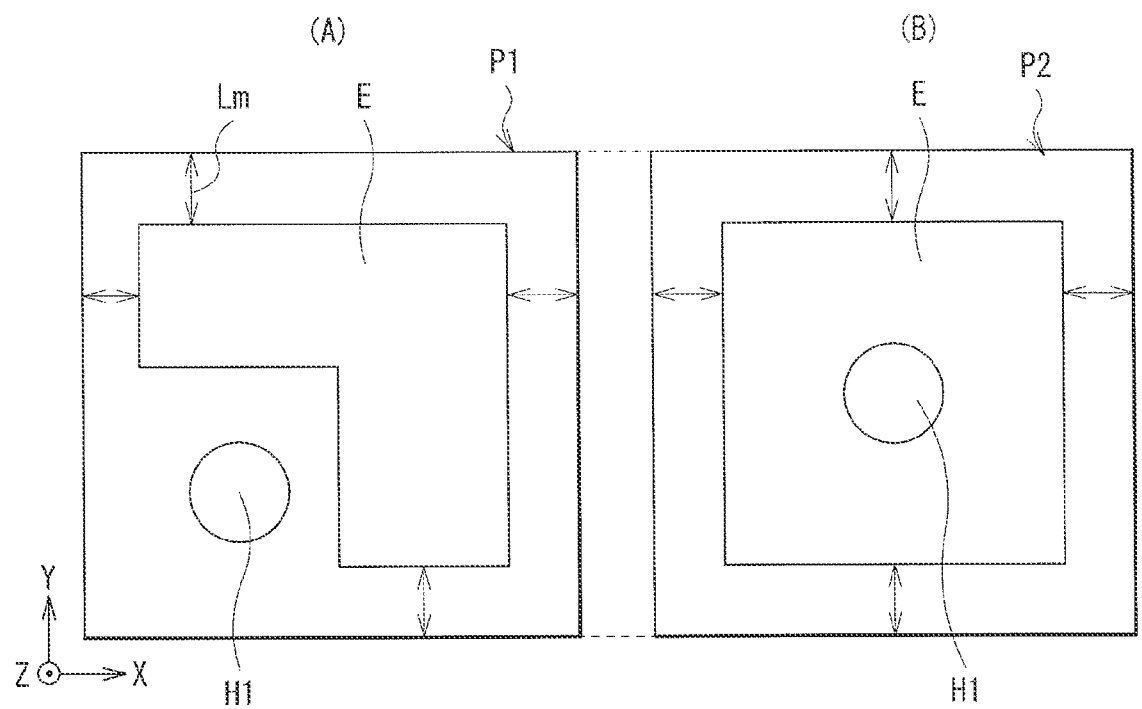
FIG. 11 is a diagram for describing a light emission region of the display unit illustrated in FIG. 1.

FIGS. 10 and 11 illustrate a planar shape of the light emission region E in a pixel (for example, the pixel PXLC in FIG. 3). A part (A) in FIG. 10 and a part (A) in FIG. 11 illustrate a pixel in which the light emission region E is formed out of a region including the connection hole H1, and a part (B) in FIG. 10 and a part (B) in FIG. 11 illustrate a pixel in which the light emission region E is formed in the region including the connection hole H1. An edge of the pixel is separated from the light emission region E by, for example, a distance Lm.

The area of the light emission region E in the part (A) in FIG. 10 and the area of the light emission region E in the part (B) in FIG. 10 are equal to each other. At this time, in the part (B) in FIG. 10, the non-light emission region around the connection hole H1 is not provided; therefore, the area of the pixel region (a pixel region P2) is allowed to be smaller than the area of the pixel region (a pixel region P1) in the part (A) in FIG. 10. In other words, in a display unit having the pixel region P2, higher definition is achievable.

On the other hand, the areas of the pixel regions (the pixel regions P1) in the parts (A) and (B) in FIG. 11 are equal to each other. At this time, in the part (B) in FIG. 11, the light emission region E expands to a portion overlapping the connection hole H1; therefore, the ratio of the light emission region E to the pixel region P1 is allowed to be higher than that in the part (A) in FIG. 11. When the ratio of the light emission region E to the pixel region P1 is increased, current density of the organic light-emitting device 20 is allowed to be reduced.

Figure 12:
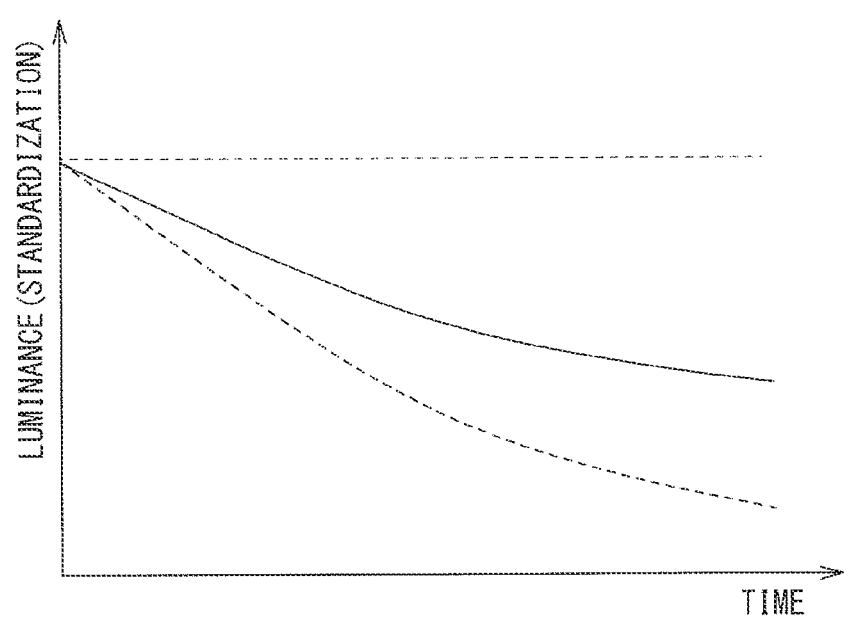
FIG. 12 is a diagram illustrating a relationship between a size of the light emission region and luminance degradation.

FIG. 12 illustrates a relationship between magnitude of current density and luminance degradation of the organic light-emitting device. A broken line indicates luminance degradation of the organic light-emitting device with relatively large current density, and a solid line indicates luminance degradation of the organic light-emitting device with relatively small current density. When the current density is reduced in such a manner, the luminance degradation of the organic light-emitting device is allowed to be reduced.

As described above, in this embodiment, since the filling member 15 is provided in the connection hole H1 of the planarization layer 13, the light emission region E is allowed to be arranged more freely. Therefore, in the display unit 1, higher definition is achievable. Moreover, the ratio of the light emission region E to the pixel region is allowed to be increased, and the current density of the organic light-emitting device 20 is allowed to be reduced.

Moreover, the material of the filling member 15 is the same as the material of the partition wall 24, and the filling member 15 and the partition wall 24 are allowed to be formed in a same process; therefore, an increase in process number is allowed to be suppressed.

Modification examples of the above-described first embodiment and other embodiments will be described below. In the following description, like components are denoted by like numerals as of the above-described first embodiment and will not be further described.

Modification Example 1

Figure 13:
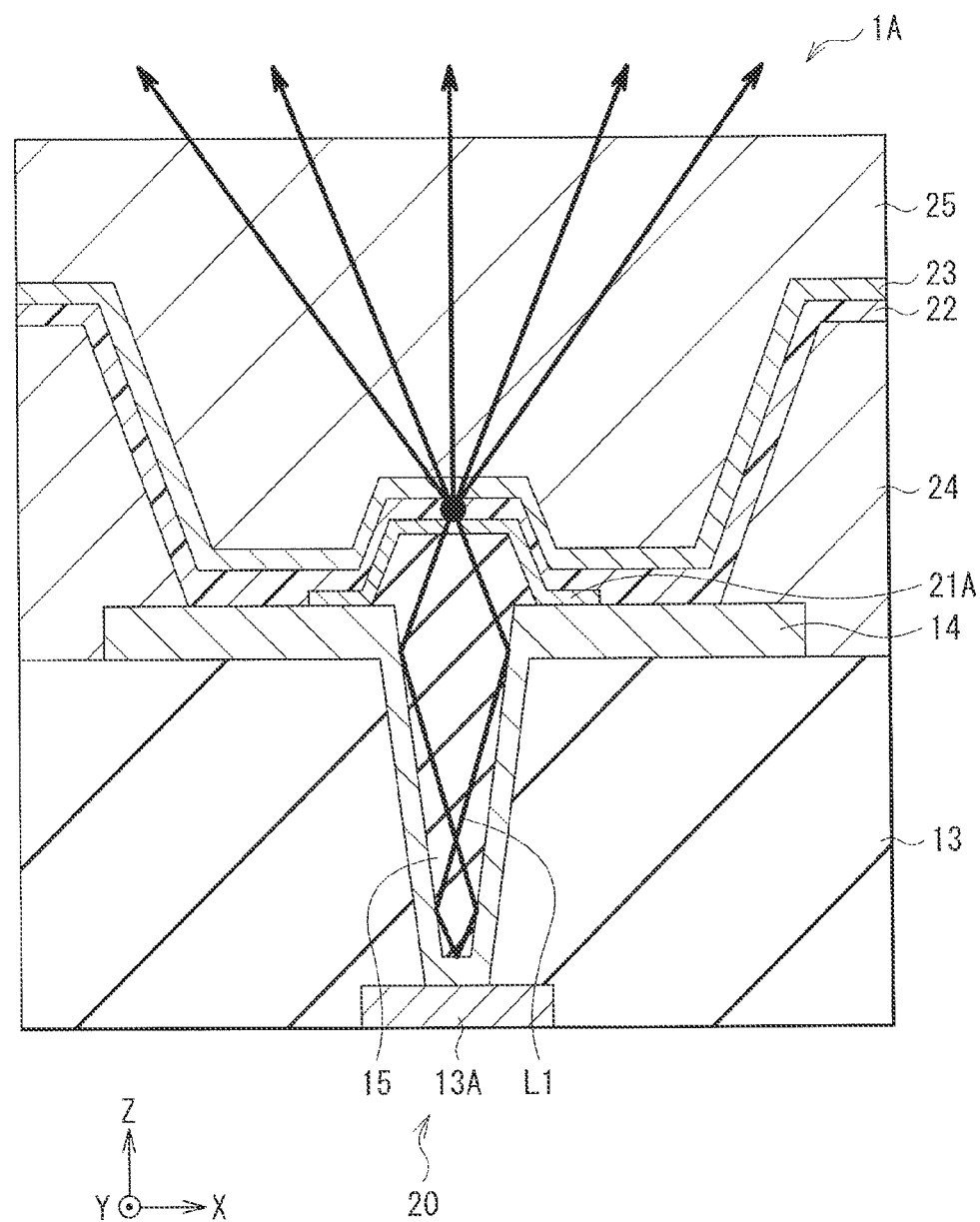
FIG. 13 is a sectional view illustrating a configuration of a display unit according to Modification Example 1.

FIG. 13 illustrates a sectional configuration of a main part of a display unit (a display unit 1A) according to Modification Example 1. In the display unit 1A, a first electrode (a first electrode 21A) is made of a light-transmissive material. Except for this point, the display unit 1 has a configuration similar to that of the display unit 1, and has functions, and effects similar to those of the display unit 1.

In the first electrode 21A, any of the conductive materials exemplified in the description of the material of the above-described second electrode 23 may be used. The relay electrode 14 is made of a high-reflective material as with the description of the display unit 1. More specifically, any of the conductive materials with light reflectivity exemplified in the description of the first electrode 21 of the above-described display unit 1 may be used for the relay electrode 14.

In such a display unit 1A, light (light L1) toward the relay electrode 14 of light emitted from the organic light-emitting device 20 is reflected by the relay electrode 14 in the connection hole H1 of the planarization layer 13. The light L1 is reflected by the relay electrode 14 to be condensed, and the light L1 passes through the first electrode 21A with light transparency to be extracted from the sealing substrate 31 (refer to FIG. 1). Therefore, in the display unit 1A, front luminance is allowed to be improved.

Modification Example 2

Figure 14:
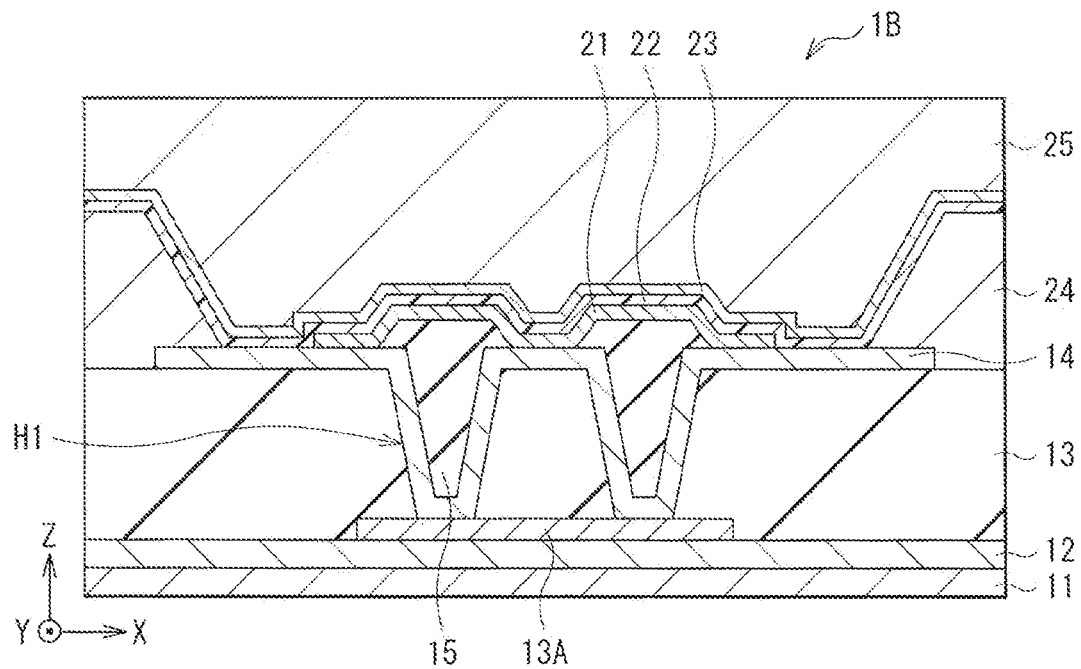
FIG. 14 is a sectional view illustrating a configuration of a display unit according to Modification Example 2.

FIG. 14 illustrates a sectional configuration of a main part of a display unit (a display unit 1B) according to Modification Example 2. As illustrated in FIG. 14, one relay electrode 14 may be connected to the drive wire 13A through a plurality of connection holes H1. At this time, the filing member 15 is provided to each of the connection holes H1. In a case where the first electrode with light transparency (the first electrode 21A in FIG. 13) and the relay electrode 14 with light reflectivity are used in combination, front luminance is allowed to be improved by providing a plurality of connection holes H1.

Modification Example 3

Figure 15:
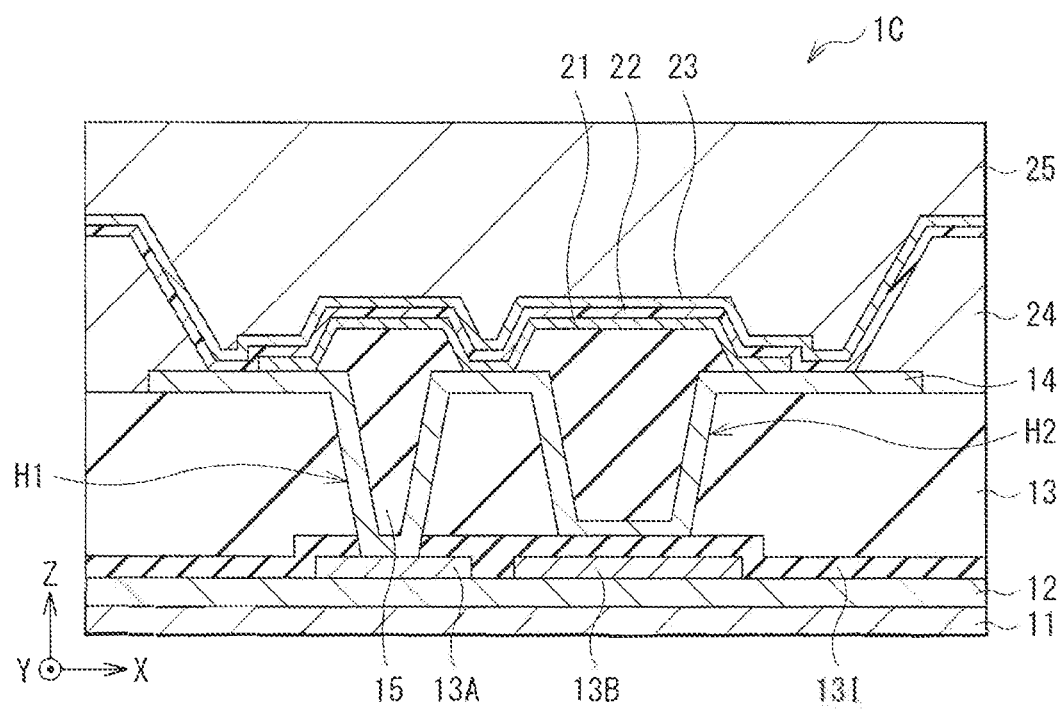
FIG. 15 is a sectional view illustrating a configuration of a display unit according to Modification Example 3.

FIG. 15 illustrates a sectional configuration of a main part of a display unit (a display unit 1C) according to Modification Example 3. The relay electrode 14 of the display unit 1C also functions as one of electrodes of the retention capacitor device (the retention capacitor device 44C in FIG. 3). Except for this point, the display unit 1C has a configuration similar to that of the display unit 1, and has functions and effects similar to those of the display unit 1.

The display unit 1C may include, for example, a capacity electrode 13B in a same layer as that of the drive wire 13A. The capacity electrode 13B is provided in a position facing a partial region of the relay electrode 14. In the planarization layer 13, a hole H2 penetrating the planarization layer 13 is provided in a position facing the capacity electrode 13B. A capacity insulating film 131 is provided between the hole H2 of the planarization layer 13 and the capacity electrode 13B. In other words, in the hole H2, the relay electrode 14 and the capacity electrode 13B face each other with the capacity insulating film 131 in between to configure a retention capacitor device. The connection hole H1 penetrates the capacity insulating film 131 to electrically connect the relay electrode 14 and the drive wire 13A to each other.

Modification Example 4

Figure 16:
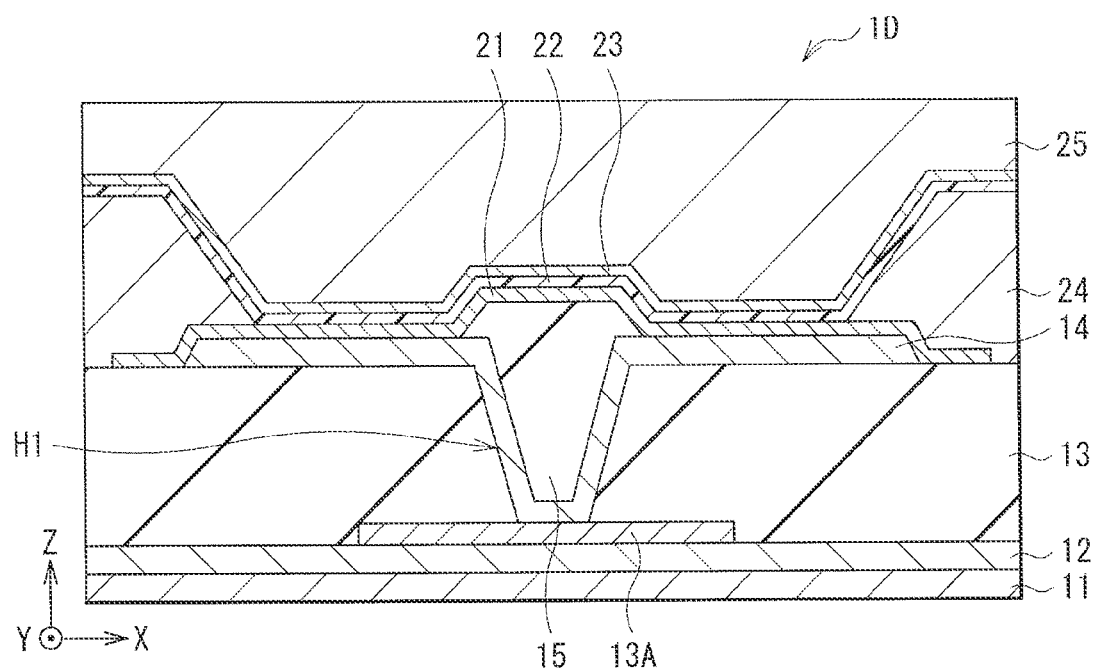
FIG. 16 is a sectional view illustrating a configuration of a display unit according to Modification Example 4.

FIG. 16 illustrates a sectional configuration of a main part of a display unit (a display unit 1D) according to Modification Example 4. In the display unit 1D, an end of the first electrode 21 together with an end of the relay electrode 14 is covered with the partition wall 24. Except for this point, the display unit 1D has a configuration similar to that of the display unit 1, and has functions and effects similar to those of the display unit 1.

The first electrode 21 may extend throughout a wider region than the relay electrode 14 in a plan view to cover the end of the relay electrode 14. In other words, the end of the first electrode 21 is provided outside the end of the relay electrode 14. In the display unit 1D, the end of the first electrode 21 is covered with the partition wall 24; therefore, the occurrence of the short circuit between the first electrode 21 and the second electrode 23 caused by the thickness of the first electrode 21 is suppressed. This will be described below.

In a case where the end of the first electrode 21 is not covered with the partition wall 24 (for example, refer to FIG. 1), the end of the first electrode 21 is exposed, and the organic layer 22 and the second electrode 23 are laminated even on the end of the first electrode 21. Since there is a level difference by the thickness of the first electrode 21 at the end of the first electrode 21, the organic layer 22 may be parted to cause a short circuit between the first electrode 21 and the second electrode 23. The occurrence of the short circuit between the first electrode 21 and the second electrode 23 caused by the thickness of the first electrode 21 is allowed to be prevented by covering the end of the first electrode 21 with the partition wall 24.

Such a partition wall 24 may be formed, for example, after the filling member 15 and the first electrode 21 are provided. It is only necessary to cover the end of the first electrode 21 with the partition wall 24, and the end of the first electrode 21 may be provided inside the end of the relay electrode 14.

Modification Example 5

Figure 17:
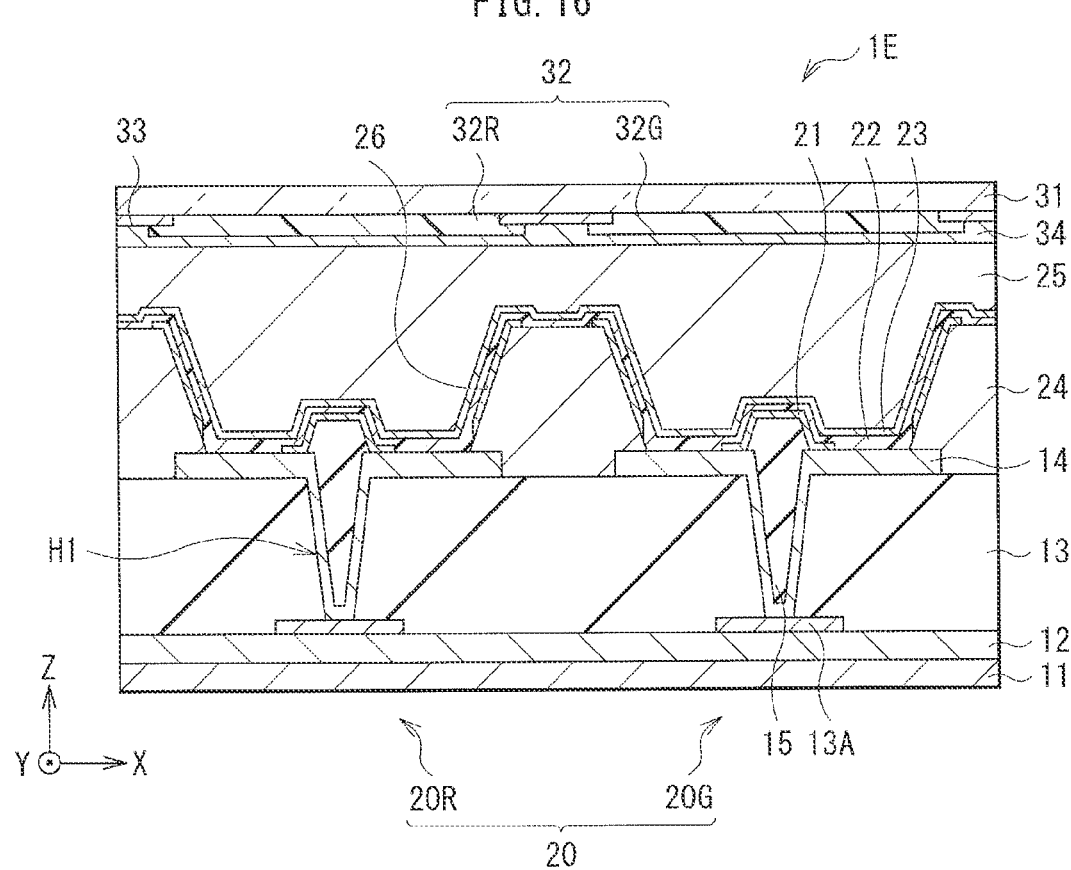
FIG. 17 is a sectional view illustrating a configuration of a display unit according to Modification Example 5.

FIG. 17 illustrates a sectional configuration of a display unit (a display unit 1E) according to Modification Example 5. The display unit 1E includes a reflecting member 26 (a first reflecting member) on a side surface of the partition wall 24. Except for this point, the display unit 1E has a configuration similar to that of the display unit 1, and has functions and effects similar to those of the display unit 1.

The reflecting member 26 is configured to reflect light emitted from the organic light-emitting device 20, and may be provided, for example, from a top surface of the partition wall 24 to the side surface of the partition wall 24. The reflecting member 26 may be made of, for example, a material similar to that of the above-described first electrode 21, and has a thickness of about 10 nm to about 100 nm both inclusive. Such a reflecting member 26 is allowed to be formed together with the first electrode 21 in a same process.

Figure 18:
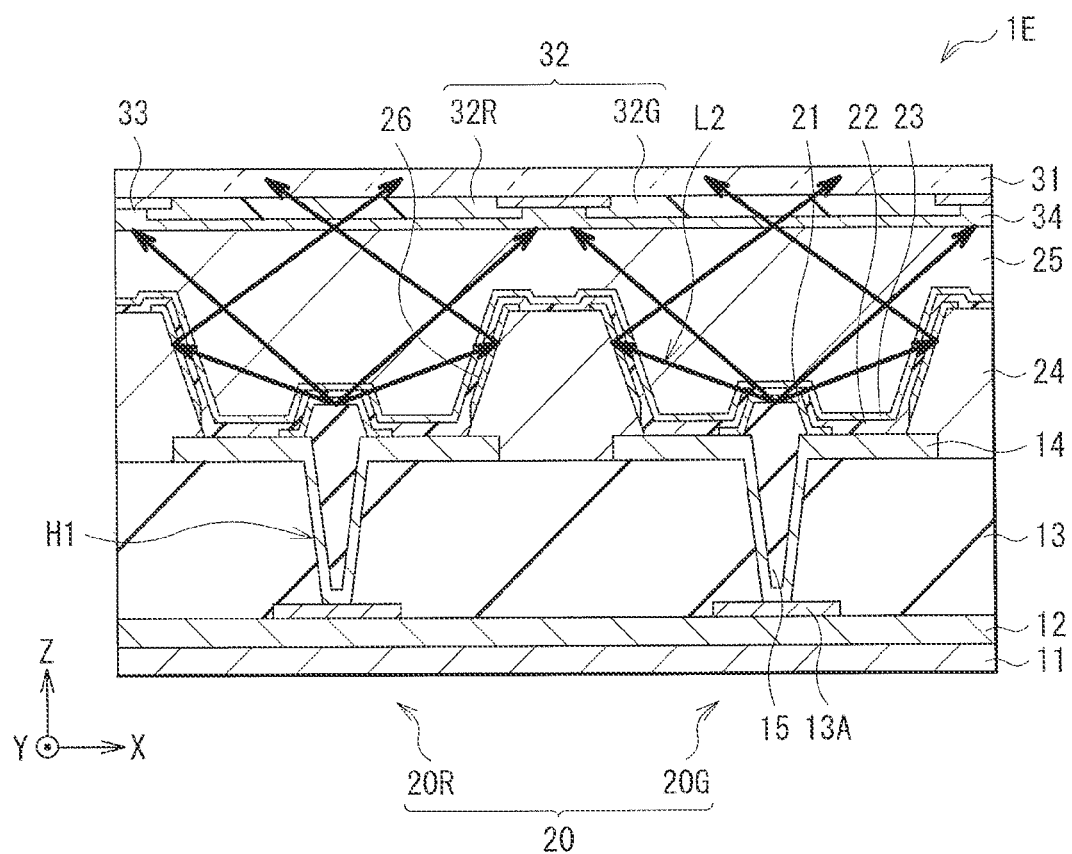
FIG. 18 is a sectional view illustrating a light emission state in the display unit illustrated in FIG. 17.

As illustrated in FIG. 18, after light (light L2) toward the partition wall 24 of light emitted from the organic light-emitting device 20 is reflected by the reflecting member 26, the light L2 is extracted from the sealing substrate 31. Since the light L2 is reflected by the reflecting member 26 in such a manner, the occurrence of color mixing is suppressed.

Figure 19:
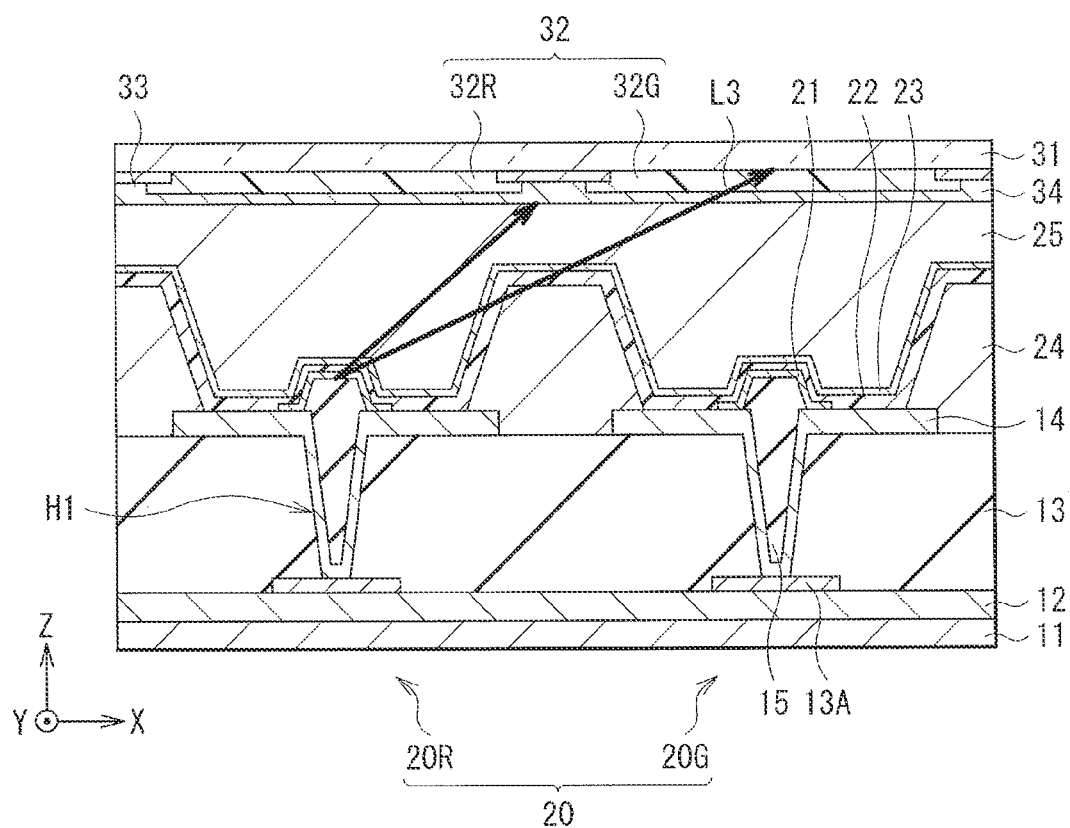
FIG. 19 is a sectional view for describing a case where color mixing occurs.

As illustrated in FIG. 19, in a case where the reflecting member is not provided, light (light L3) toward the partition wall 24 of the light emitted from the organic light-emitting device 20 passes through the partition wall 24; therefore, for example, light emitted from the organic light-emitting device 20R configuring the red pixel PXLC may pass through the green filter 32G to be extracted. Such light L3 becomes leak light to the green pixel PXLC located adjacent to the red pixel PXLC to cause color mixing.

On the other hand, when the side surface of the partition wall 24 is covered with the reflecting member 26, the light L2 is reflected by the reflecting member 26 toward a central portion of each of the pixels PXLC. Therefore, leak light toward the adjacent pixels PXLC is allowed to be prevented, and the occurrence of color mixing is allowed to be suppressed. Moreover, front luminance is allowed to be improved in the display unit 1E.

Figure 20:
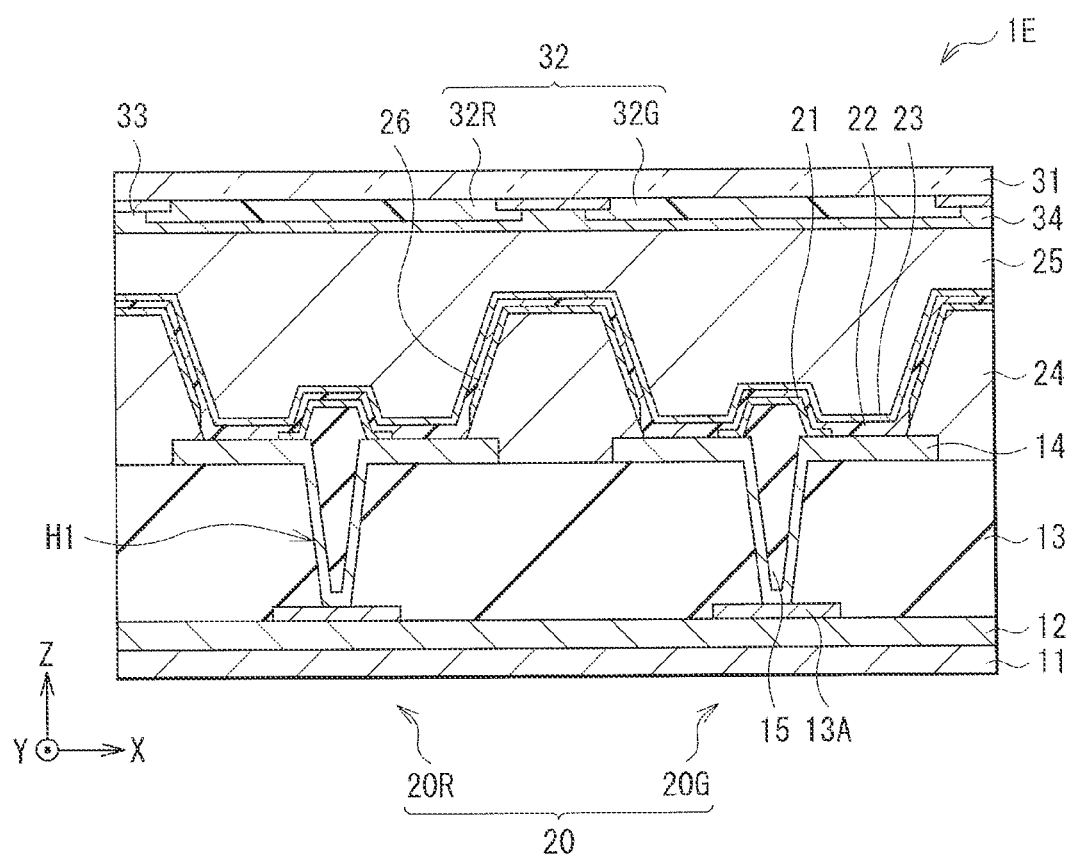
FIG. 20 is a sectional view illustrating another example of the display unit illustrated in FIG. 17.

The reflecting member 26 may be provided separately for each side surface of the partition wall 24 (refer to FIG. 17), and as illustrated in FIG. 20, the reflecting member 26 may be integrally provided from the top surface of the partition wall 24 to each side surface of the partition wall 24.

Second Embodiment

Figure 21:
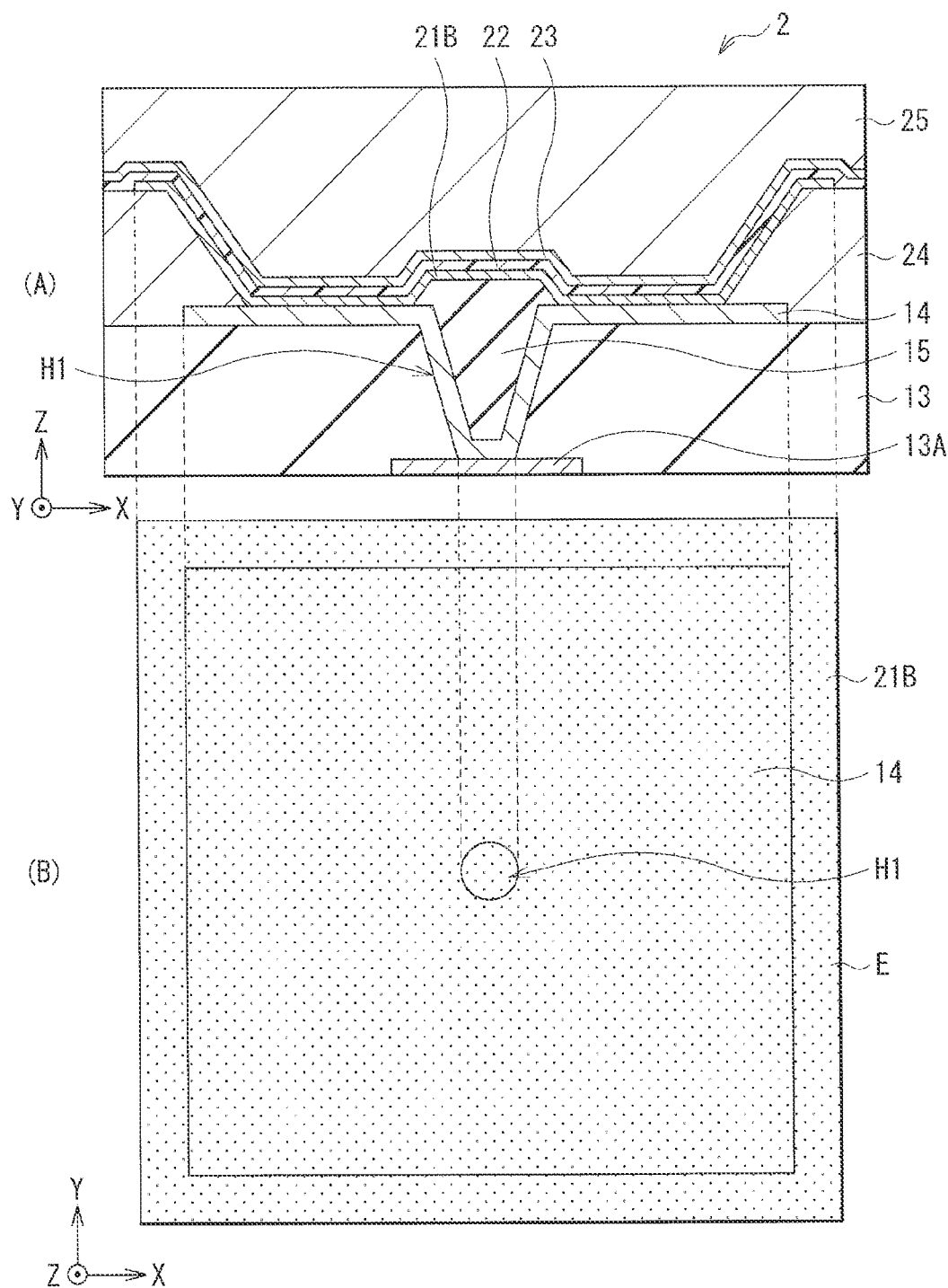
FIG. 21 is a diagram illustrating a configuration of a main part of a display unit according to a second embodiment of the present technology.

FIG. 21 illustrates a sectional configuration of a main part of a display unit (a display unit 2) according to a second embodiment of the present technology. A part (A) in FIG. 21 illustrates a sectional configuration and a part (B) in FIG. 21 illustrates a planar configuration. In the display unit 2, the first electrode (a first electrode 21B) extends on the partition wall 24, and the shape of the light emission region E is controlled by the first electrode 21B. Except for this point, the display unit 2 has a configuration similar to that of the display unit 1, and has functions and effects similar to those of the display unit 1.

The first electrode 21B may be provided throughout a wider region than the relay electrode 14 in a plan view (refer to the part (B) in FIG. 21). The first electrode 21B covers the filling member 15, and extends to the surrounding of the filling member 15 to also cover the side surface of the partition wall 24. Light is emitted from above the partition wall 24 covered with the first electrode 21B, and a region where the first electrode 21B is provided serves as the light emission region E.

Figure 22:
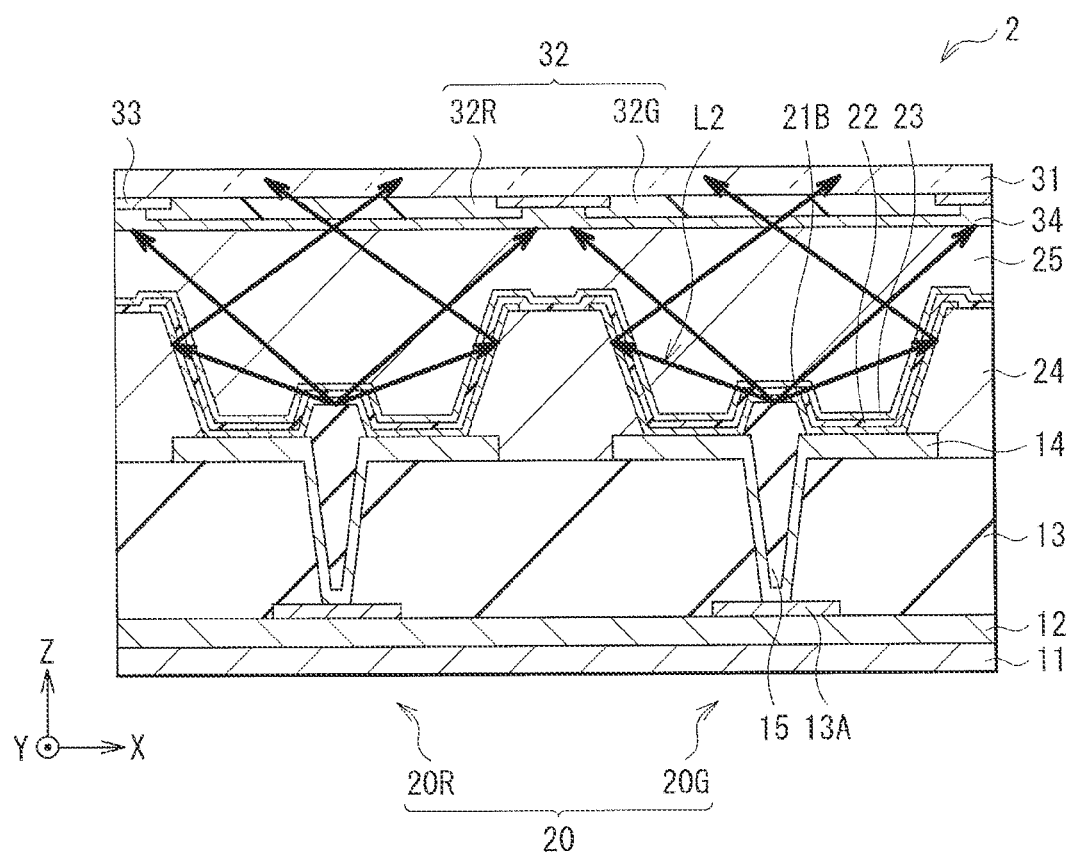
FIG. 22 is a sectional view illustrating a light emission state in the display unit illustrated in FIG. 21.

As illustrated in FIG. 22, when the first electrode 21B is made of a light-reflective material, the light L2 toward the partition wall 24 of the light emitted from the organic light-emitting device 20 is reflected by the first electrode 21B on the side surface of the partition wall 24, and then is extracted from the sealing substrate 31. Therefore, in a similar manner to the description of the above-described display unit 1E, the occurrence of color mixing is allowed to be suppressed, and front luminance is allowed to be improved.

Modification Example 6

Figure 23:
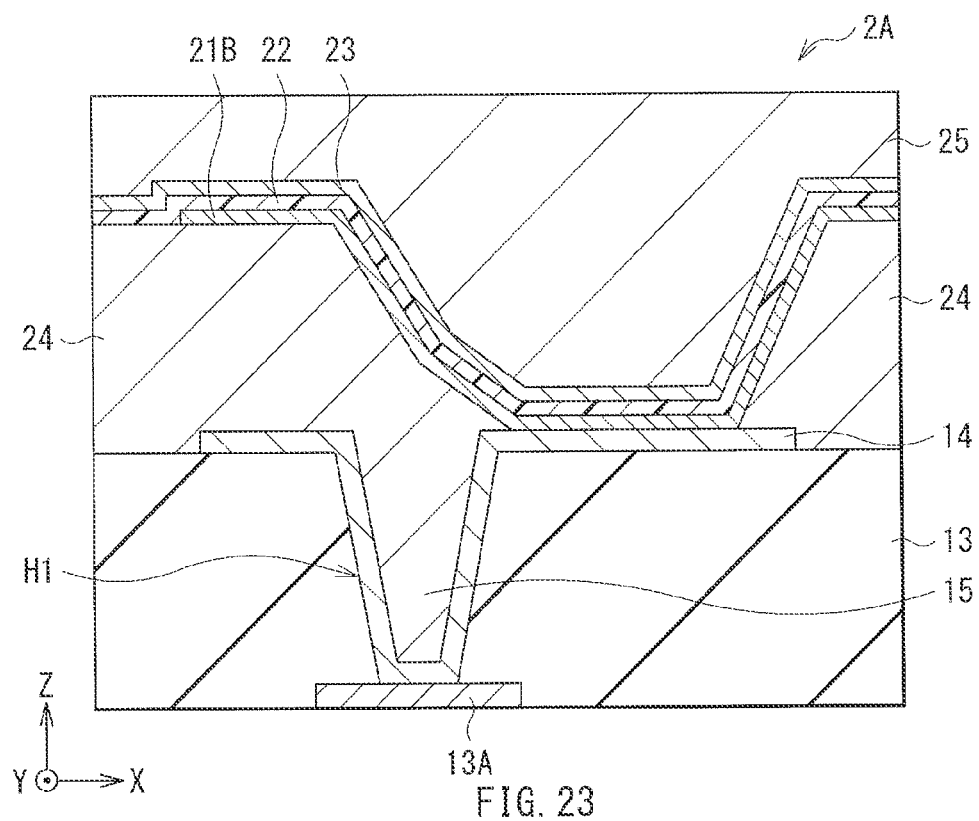
FIG. 23 is a sectional view illustrating a configuration of a display unit according to Modification Example 6.

FIG. 23 illustrates a sectional configuration of a display unit (a display unit 2A) according to Modification Example 6. In the display unit 2A, the filling member 15 and the partition wall 24 are in contact with each other, and are integrally formed. Except for this point, the display unit 2A has a configuration similar to that of the display unit 2, and has functions and effects similar to those of the display unit 2.

For example, the filing member 15 and the partition wall 24 having different heights from each other are integrally formed by gradually changing their heights (refer to FIG. 23).

Figure 24:
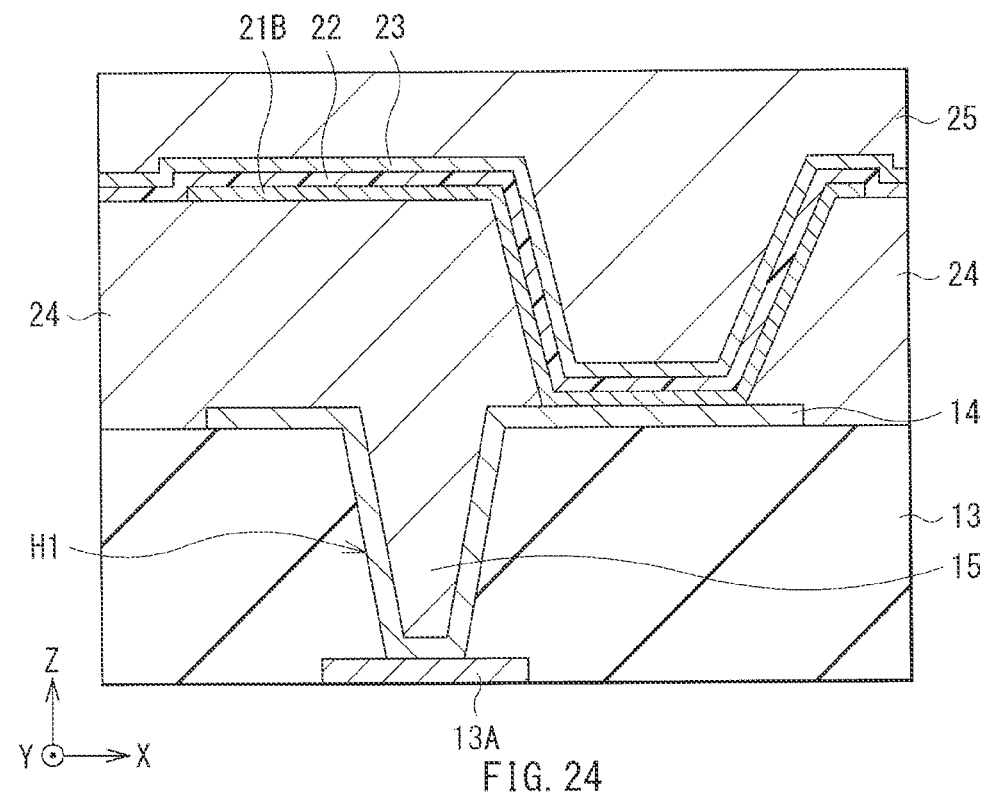
FIG. 24 is a sectional view illustrating another example of a filling member illustrated in FIG. 23.

As illustrated in FIG. 24, the filing member 15 and the partition wall 24 may be integrally formed by allowing the height of the filling member 15 to be equal to the height of the partition wall 24.

Modification Example 7

Figure 25:
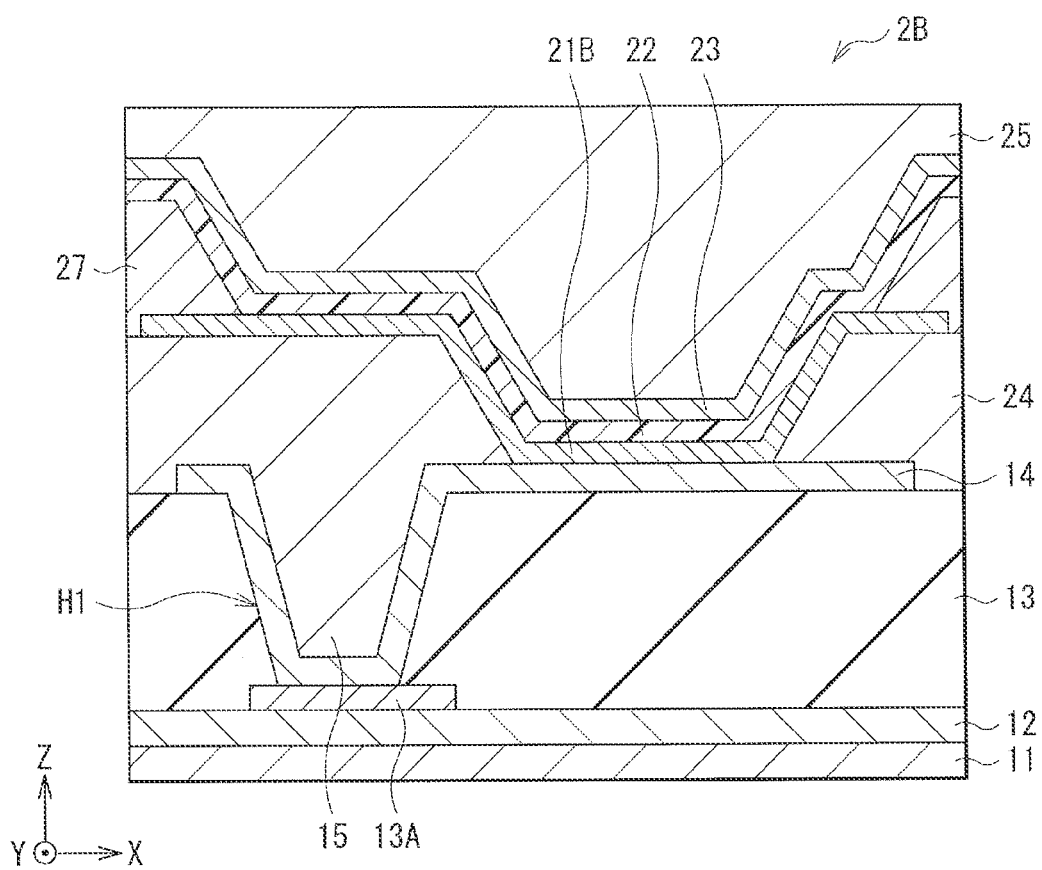
FIG. 25 is a sectional view illustrating a configuration of a display unit according to Modification Example 7.

FIG. 25 illustrates a sectional configuration of a display unit (a display unit 2B) according to Modification Example 7. In the display unit 2B, the end of the first electrode 21B is covered with a partition wall 27 (a second partition wall). Except for this point, the display unit 2B has a configuration similar to that of the display unit 2, and has functions and effects similar to those of the display unit 2.

For the partition wall 27, for example, an insulating material similar to that of the above-described partition wall 24 may be used. For example, such a partition wall 27 is provided on the partition wall 24 to cover the end of the first electrode 21B. After the first electrode 21B is provided on the partition wall 24, the partition wall 27 is allowed to be formed by forming a film of an insulating material on the entire surface of the substrate 11, and patterning the film with use of, for example, a photolithography method.

When such a partition wall 27 is provided, the occurrence of a short circuit between the first electrode 21B and the second electrode 23 caused by the thickness of the first electrode 21B is allowed to be prevented in a manner similar to the description of the above-described display unit 1D.

Third Embodiment

Figure 26:
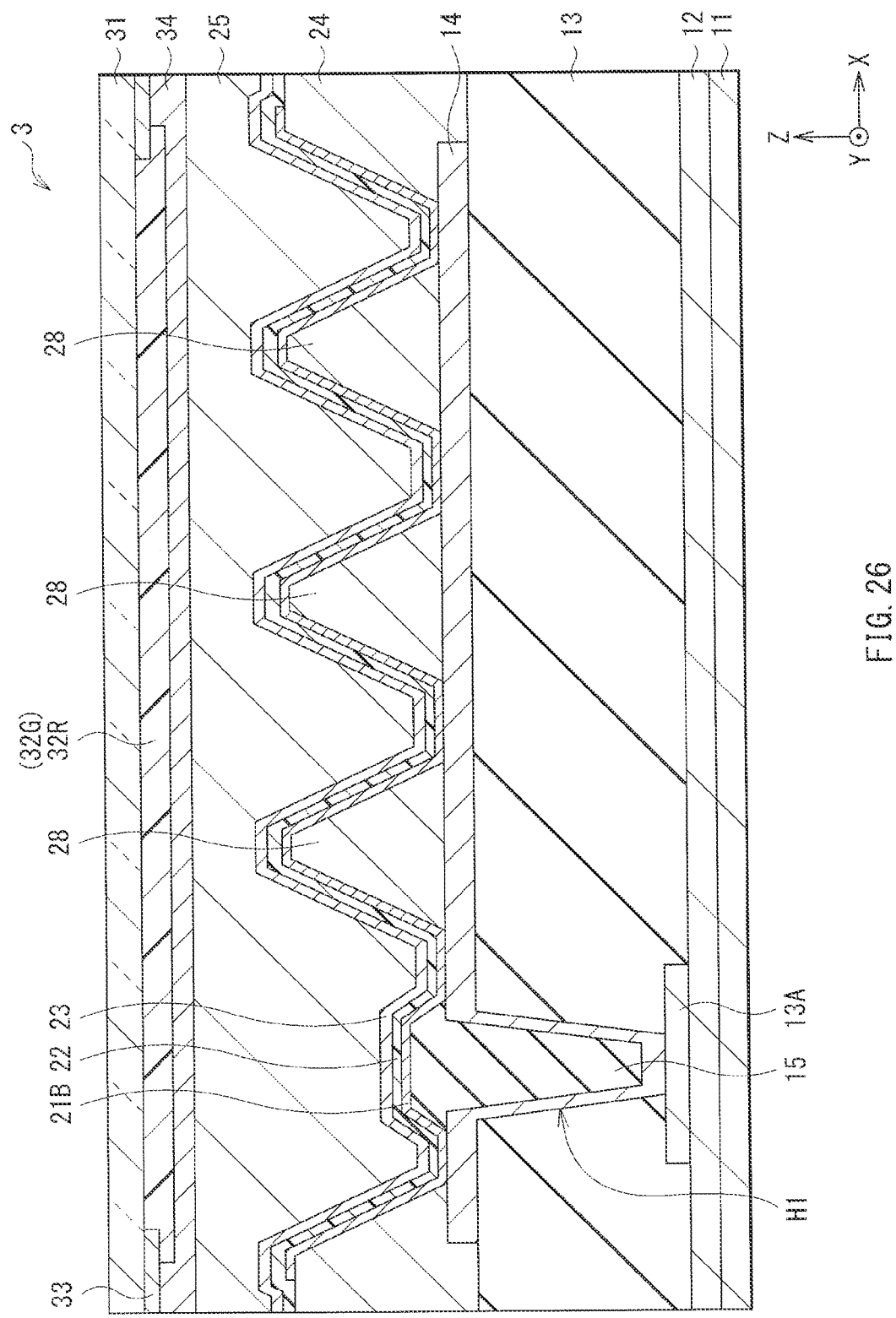
FIG. 26 is a diagram illustrating a configuration of a main part of a display unit according to a third embodiment of the present technology.

FIG. 26 illustrates a sectional configuration of a main part of a display unit (a display unit 3) according to a third embodiment of the present technology. The display unit 3 further includes a partition wall 28 (a third partition wall) between the partition walls 24 provided to both ends of the relay electrode 14. Except for this point, the display unit 3 has a configuration similar to that of the display unit 1, and has functions and effects similar to those of the display unit 1.

The partition wall 28 is so provided as to cover a part of the surface of the relay electrode 14. One partition wall 28 may be provided to one relay electrode 14 (not illustrated), or a plurality of partition walls 28 may be provided to one relay electrode 14. The plurality of partition walls 28 are arranged at predetermined intervals on the relay electrode 14. FIG. 26 illustrates a case where three partition walls 28 are provided between the partition walls 24 provided to both ends of the relay electrode 14; however, the number of the partition walls 28 may be any number. Protrusions and depressions are formed on the surface of the relay electrode 14 by providing such partition walls 28. The partition wall 28 may be made of, for example, the same material as that of the above-described partition wall 24, and has a height equal to the height of the partition wall 24. The partition wall 28 may be formed in the same process as the process of forming the partition wall 24.

Figure 27:
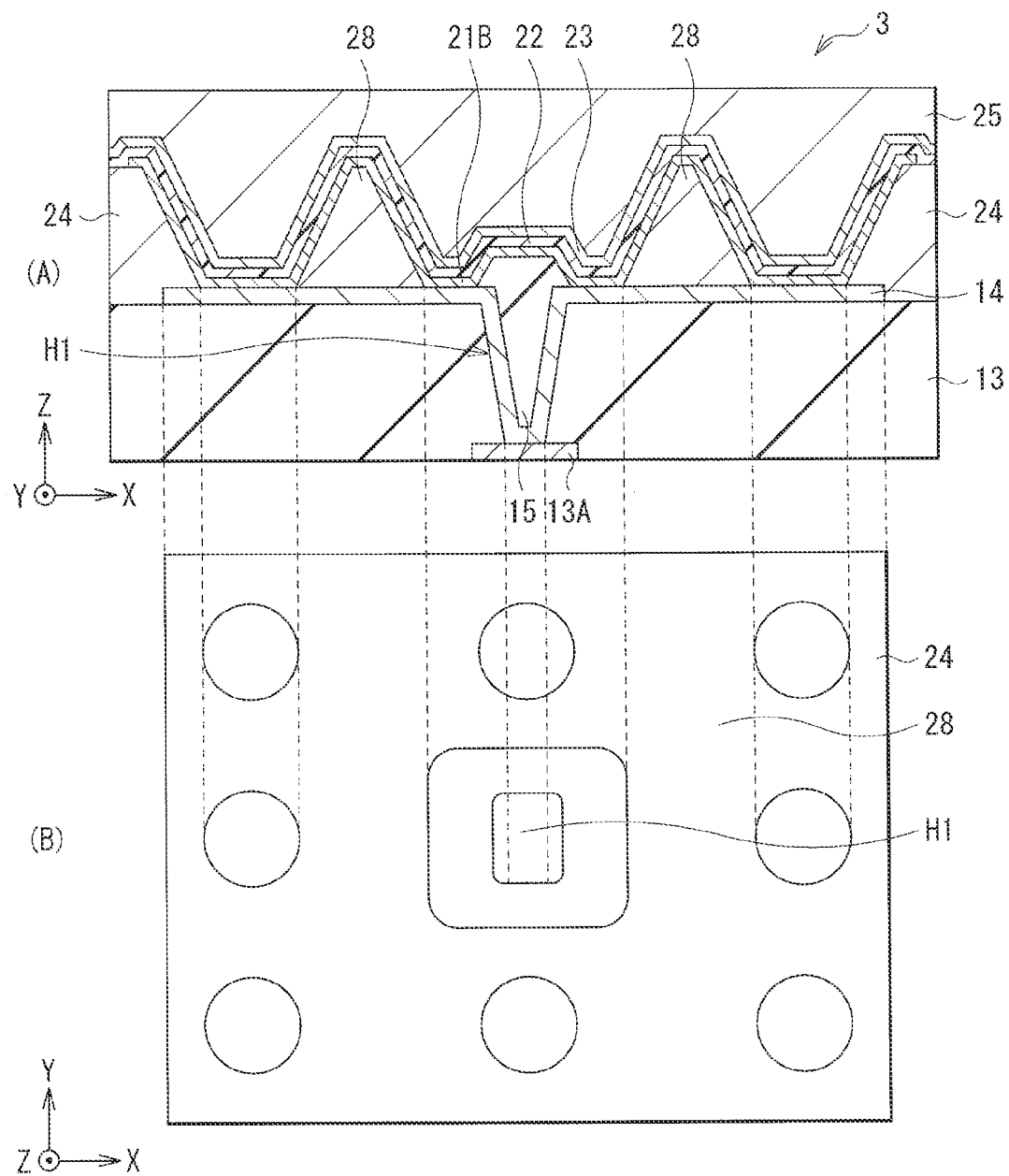
FIG. 27 is a diagram illustrating an example of a configuration of a partition wall illustrated in FIG. 26.
Figure 28:
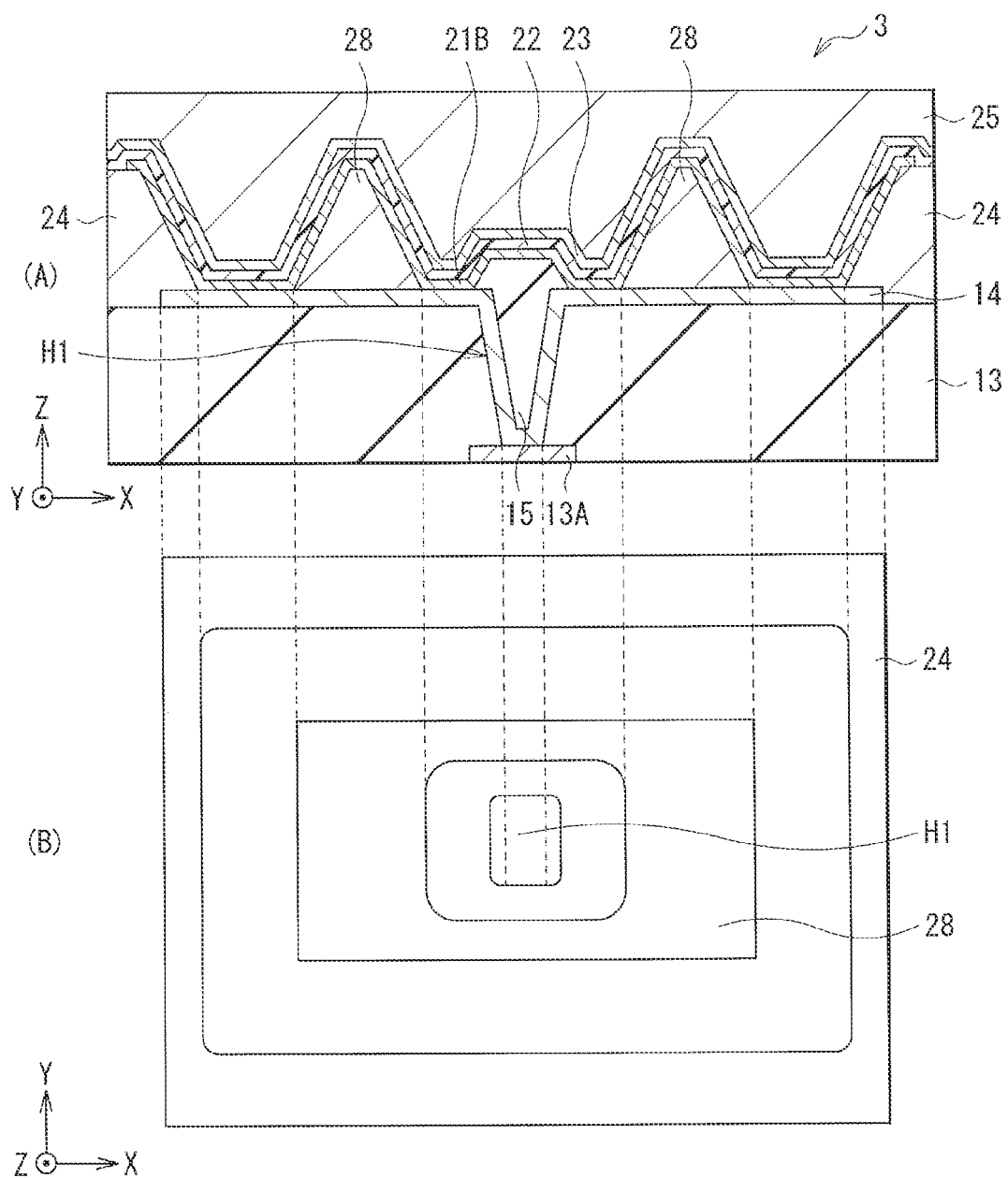
FIG. 28 is a diagram illustrating another example of the configuration of the partition wall illustrated in FIG. 26.
Figure 29:
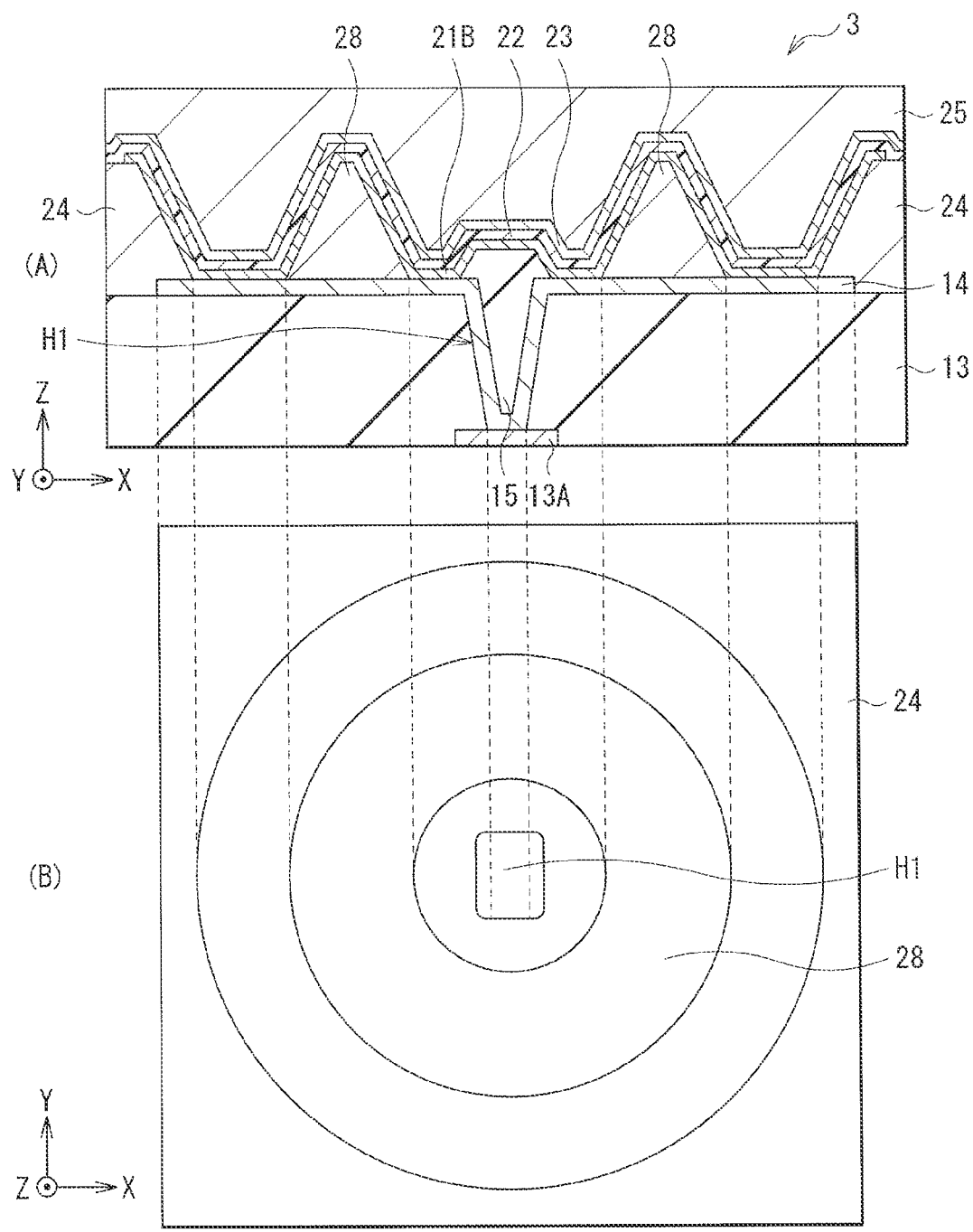
FIG. 29 is a diagram illustrating still another example of the configuration of the partition wall illustrated in FIG. 26.

FIGS. 27, 28, and 29 illustrates an example of configurations of the partition walls 24 and 28. A part (A) in FIG. 27, a part (A) in FIG. 28, and a part (A) in FIG. 29 illustrate sectional configuration examples of the partition walls 24 and 28, and a part (B) in FIG. 27, a part (B) in FIG. 28, and a part (B) in FIG. 29 illustrate planar configuration examples of the partition walls 24 and 28. As illustrated in the part (B) in FIG. 27, the partition wall 24 and the partition wall 28 may be integrated. At this time, the relay electrode 14 and the first electrode 21B may be in contact with each other in, for example, an island-shaped region such as a dot shaped region. Alternatively, as illustrated in the part (B) in FIG. 28 and the part (B) in FIG. 29, the partition wall 24 and the partition wall 28 may be separated from each other. The partition wall 28 may be formed, for example, in a rectangular shape (refer to the part (B) in FIG. 28) or in a circular shape (refer to the part (B) in FIG. 29) around the connection hole H1.

The first electrode 21B covers the partition wall 28 (refer to FIG. 26), and the organic layer 22 and the second electrode 23 are laminated on the first electrode 21B. Thus, a surface area of the organic layer 22 formed along a surface with protrusions and depressions is larger than a surface of the organic layer 22 provided on a flat surface (for example, refer to the display unit 2 in FIG. 21). Therefore, the capacity of the auxiliary capacitor device 44D (refer to FIG. 3) is allowed to be increased.

In the display unit 3, a region where the first electrode 21B is provided serves as the light emission region E, and light is also emitted from above the partition wall 28.

Figure 30:
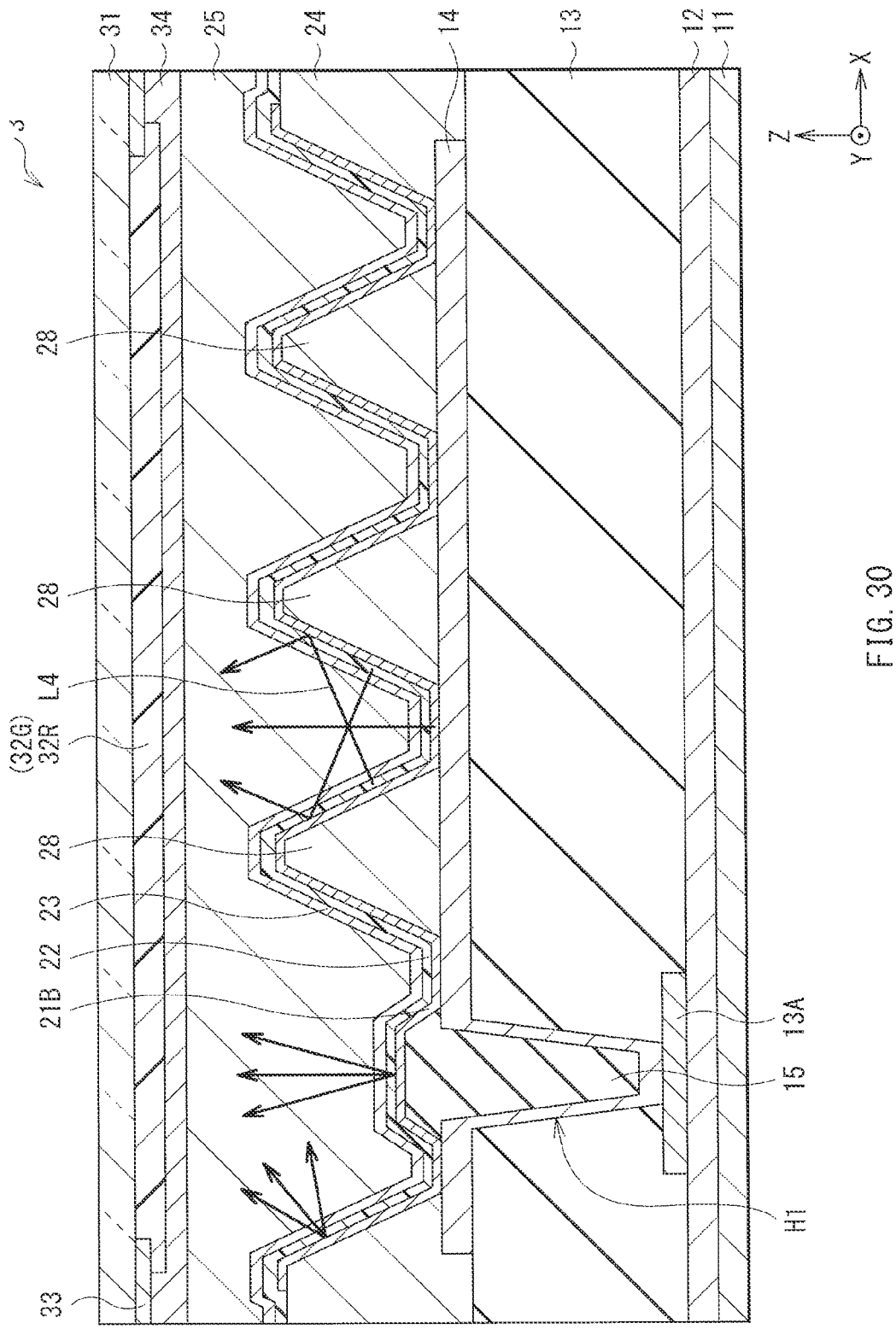
FIG. 30 is a sectional view illustrating a light emission state in the display unit illustrated in FIG. 26.

As illustrated in FIG. 30, when the first electrode 21B is made of a light-reflective material, light (light L4) toward the partition wall 28 of light emitted from the organic light-emitting device 20 is reflected by the first electrode 21B on a side surface of the partition wall 28, and then is extracted from the sealing substrate 31. Therefore, in a manner similar to the description of the above-described display unit 1E, the occurrence of color mixing is suppressed, and front luminance is allowed to be improved.

Figure 31:
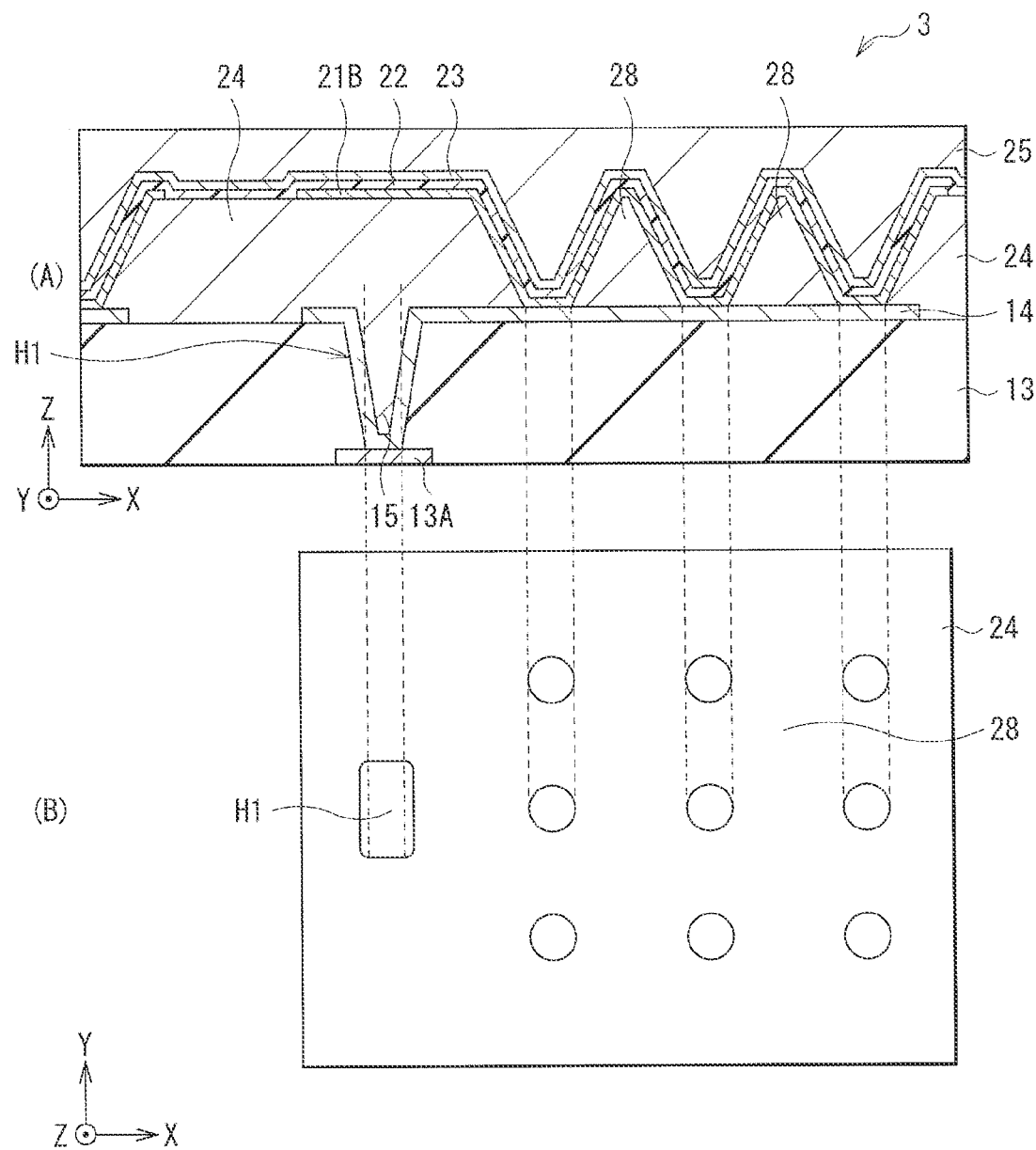
FIG. 31 is a diagram illustrating another example of the display unit illustrated in FIG. 26.
Figure 32:
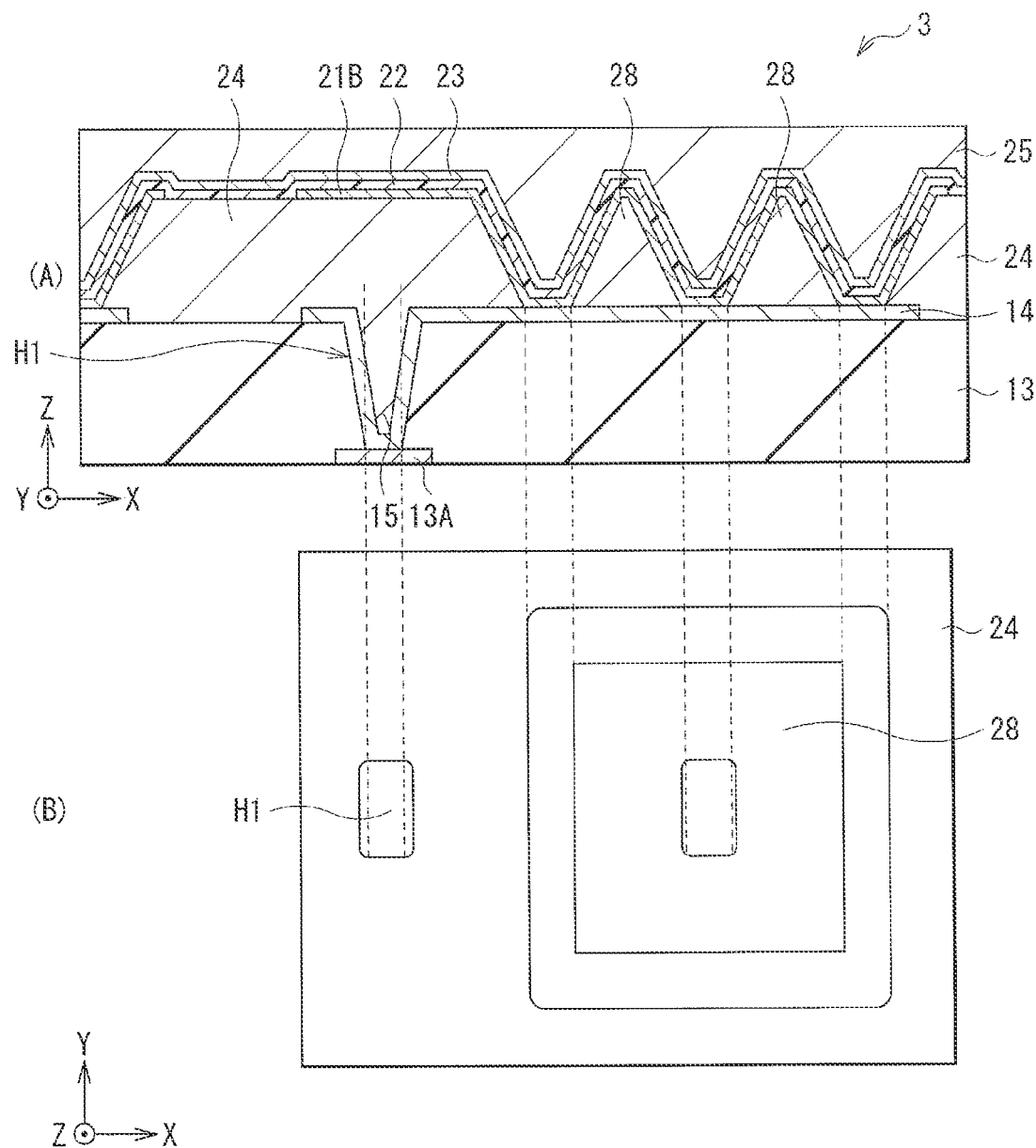
FIG. 32 is a diagram illustrating another example of the configuration of the partition wall illustrated in FIG. 31.
Figure 33:
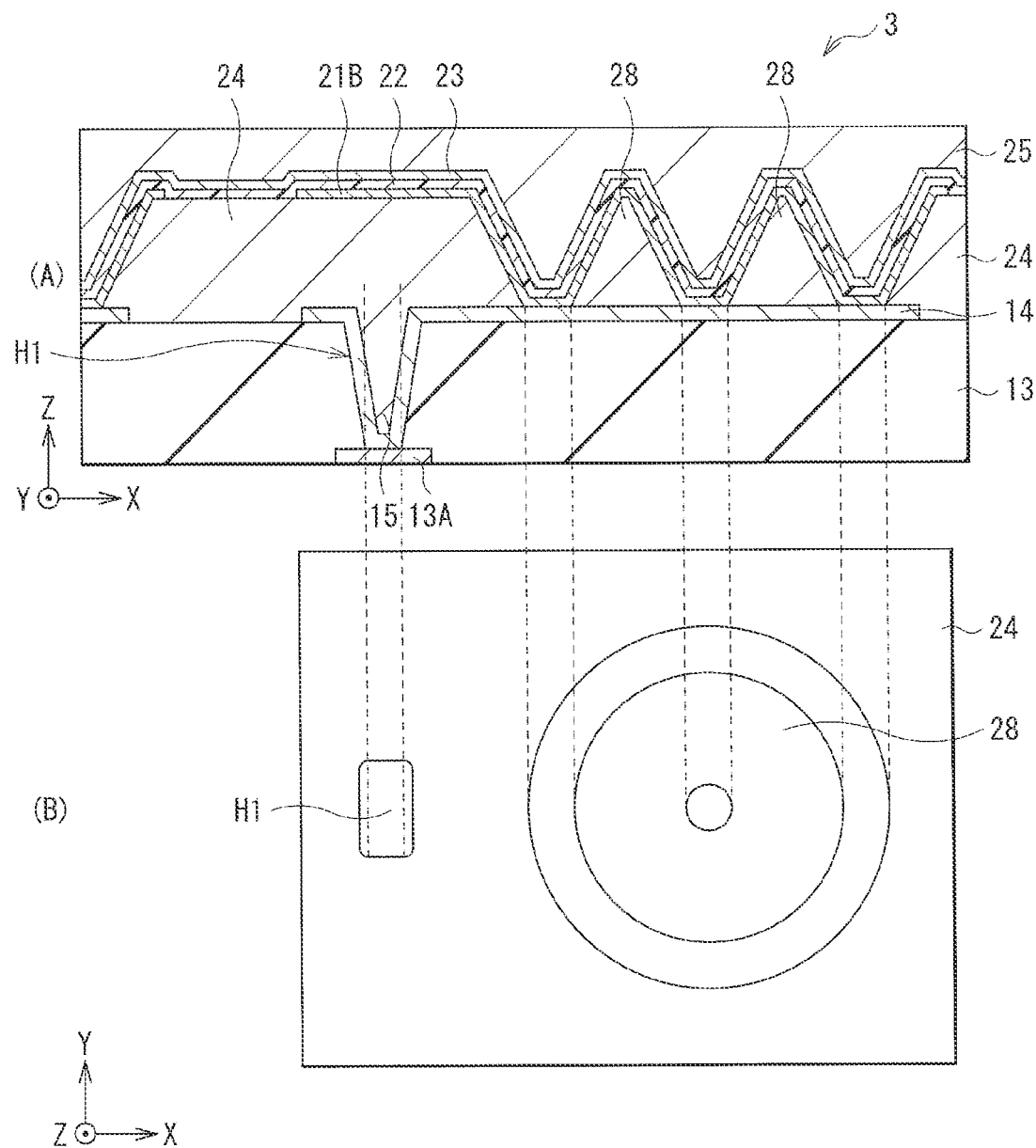
FIG. 33 is a diagram illustrating still another example of the configuration of the partition wall illustrated in FIG. 31.

As illustrated in FIGS. 31, 32, and 33, the filling member 15 and the partition wall 24 may be integrated. A part (A) in FIG. 31, a part (A) in FIG. 32, and a part (A) in FIG. 33 illustrate sectional configuration examples of the partition walls 24 and 28, and a part (B) in FIG. 31, a part (B) in FIG. 32, and a part (B) in FIG. 33 illustrate planar configuration examples of the partition walls 24 and 28. As with the above description referring to FIGS. 27, 28, and 29, the partition wall 24 and the partition wall 28 may be integrated (refer to FIG. 31), or the partition wall 24 and the partition wall 28 may be separated from each other (refer to FIGS. 32 and 33).

Figure 34:
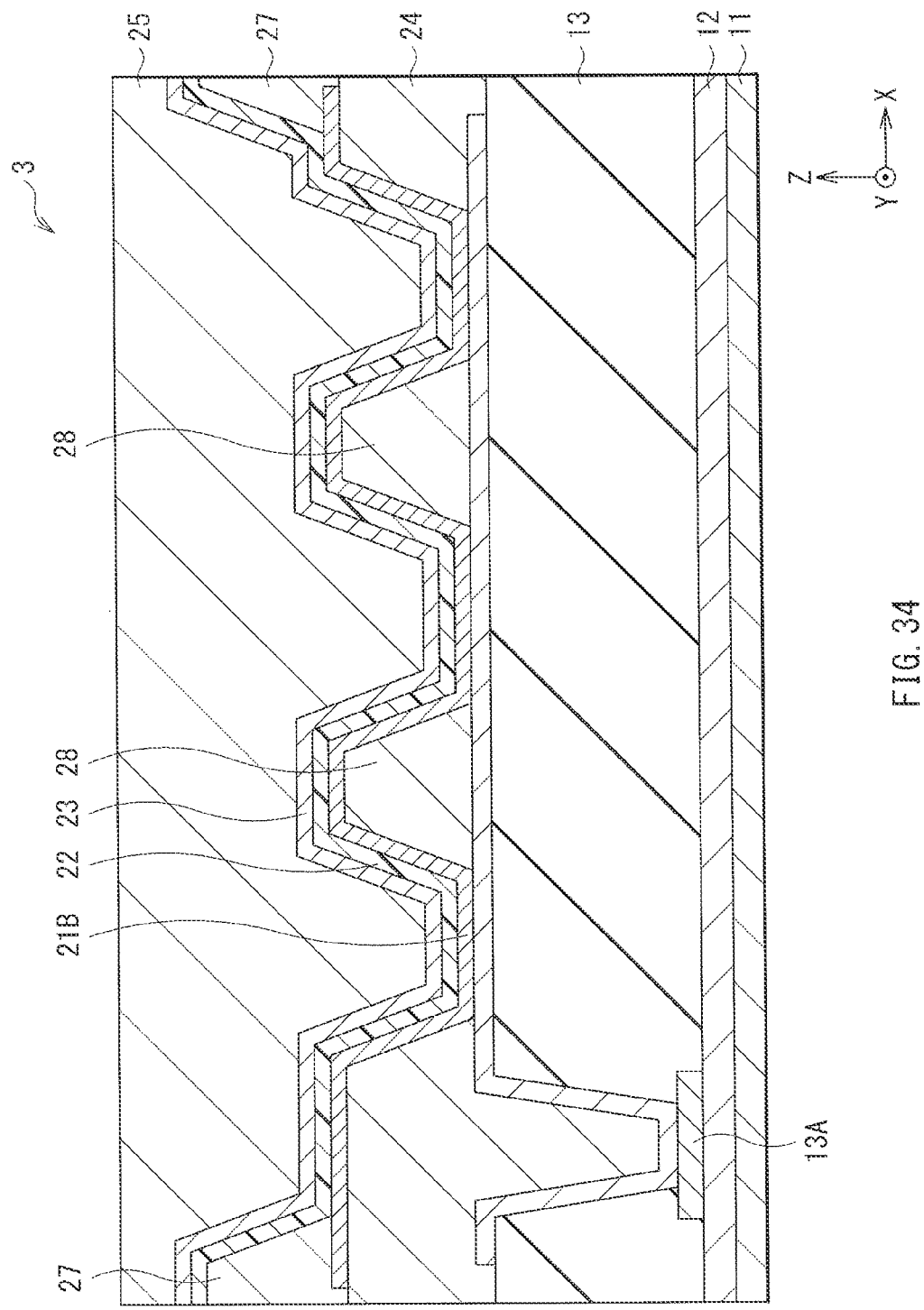
FIG. 34 is a diagram illustrating still another example of the display unit illustrated in FIG. 26.

Moreover, as illustrated in FIG. 34, a partition wall 27 configured to cover the end of the first electrode 21B may be provided.

Modification Example 8

Figure 35:
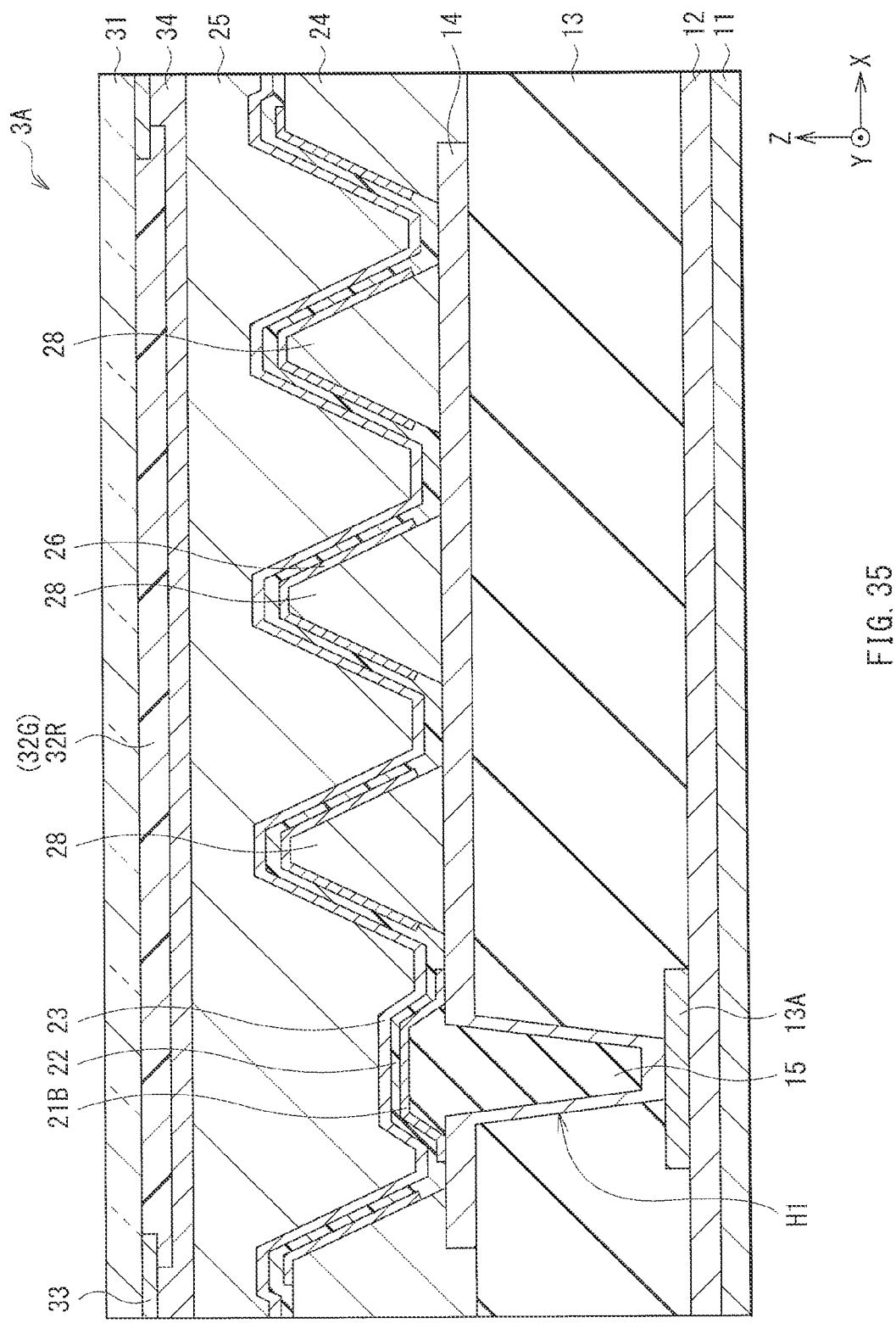
FIG. 35 is a sectional view illustrating a configuration of a display unit according to Modification Example 8.

FIG. 35 illustrates a sectional configuration of a display unit (a display unit 3A) according to Modification Example 8. The display unit 3A includes a reflecting member 26 (a second reflecting member) on a side surface of the partition wall 28. Except for this point, the display unit 3A has a configuration similar to that of the display unit 3, and has functions and effects similar to those of the display unit 3.

The first electrode 21B of the display unit 3A is provided on the connection hole H1 and its neighborhood, and is not provided on the side surfaces of the partition walls 24 and 28. The side surfaces of the partition walls 24 and 28 are covered with the reflecting member 26.

The first electrode 21B, the organic layer 22, and the second electrode 23 are laminated in this order on the connection hole H1 and its neighborhood, and the relay electrode 14, the organic layer 22, and the second electrode 23 are laminated in this order in a space between the partition walls 24 and 28 (between the partition walls 28 and between the partition wall 28 and the partition wall 24). Therefore, in the display unit 3A, light is emitted from above the connection hole H1 and its neighborhood and from the space between the partition walls 24 and 28.

Figure 36:
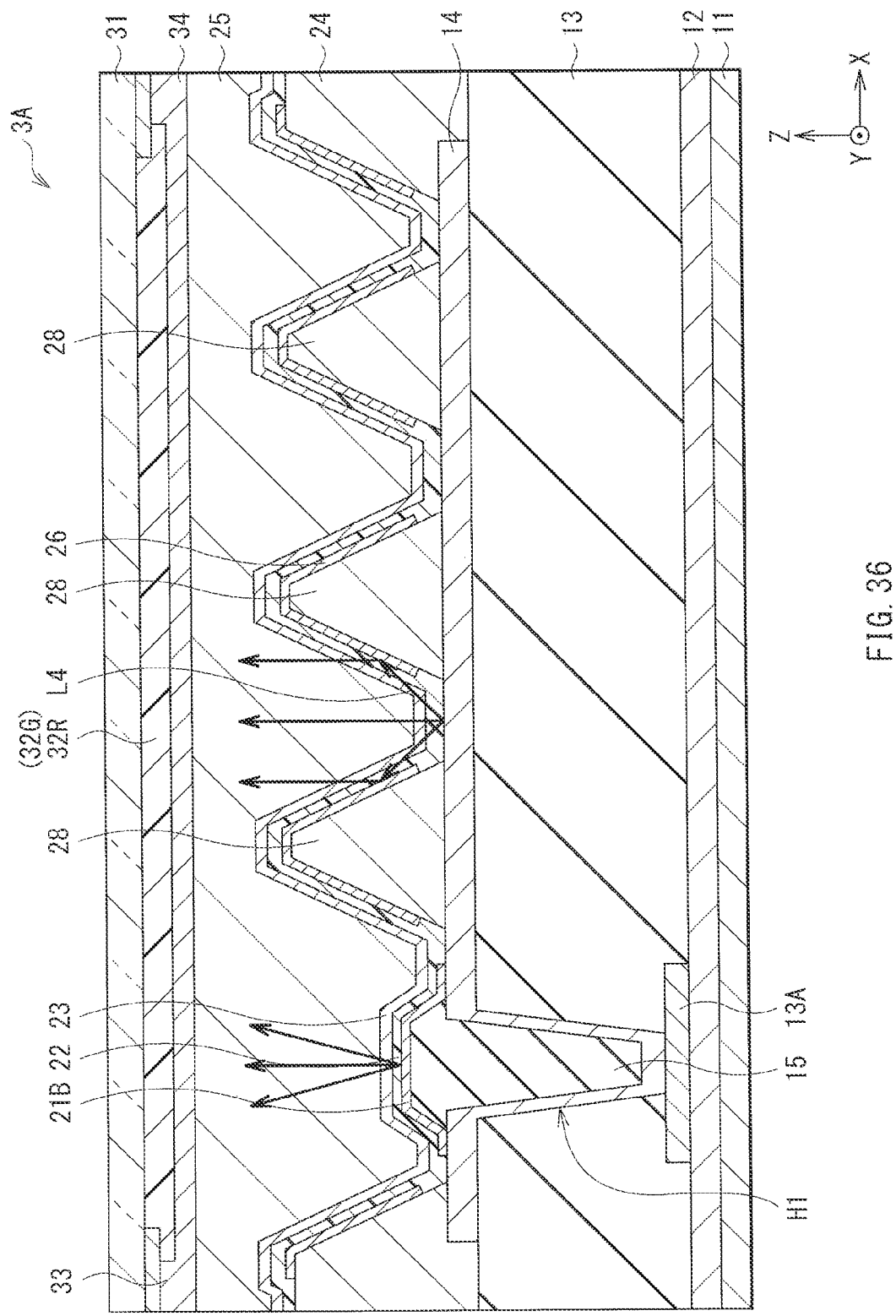
FIG. 36 is a sectional view illustrating a light emission state in the display unit illustrated in FIG. 35.

As illustrated in FIG. 36, in the display unit 3A, the light L4 toward the partition wall 28 of the light emitted from the organic light-emitting device 20 is reflected by the reflecting member 26 on the side surface of the partition wall 28, and then is extracted from the sealing substrate 31. Therefore, in a manner similar to the description of the above-described display unit 1E, the occurrence of color mixing is suppressed, and front luminance is allowed to be improved.

Modification Example 9

Figure 37:
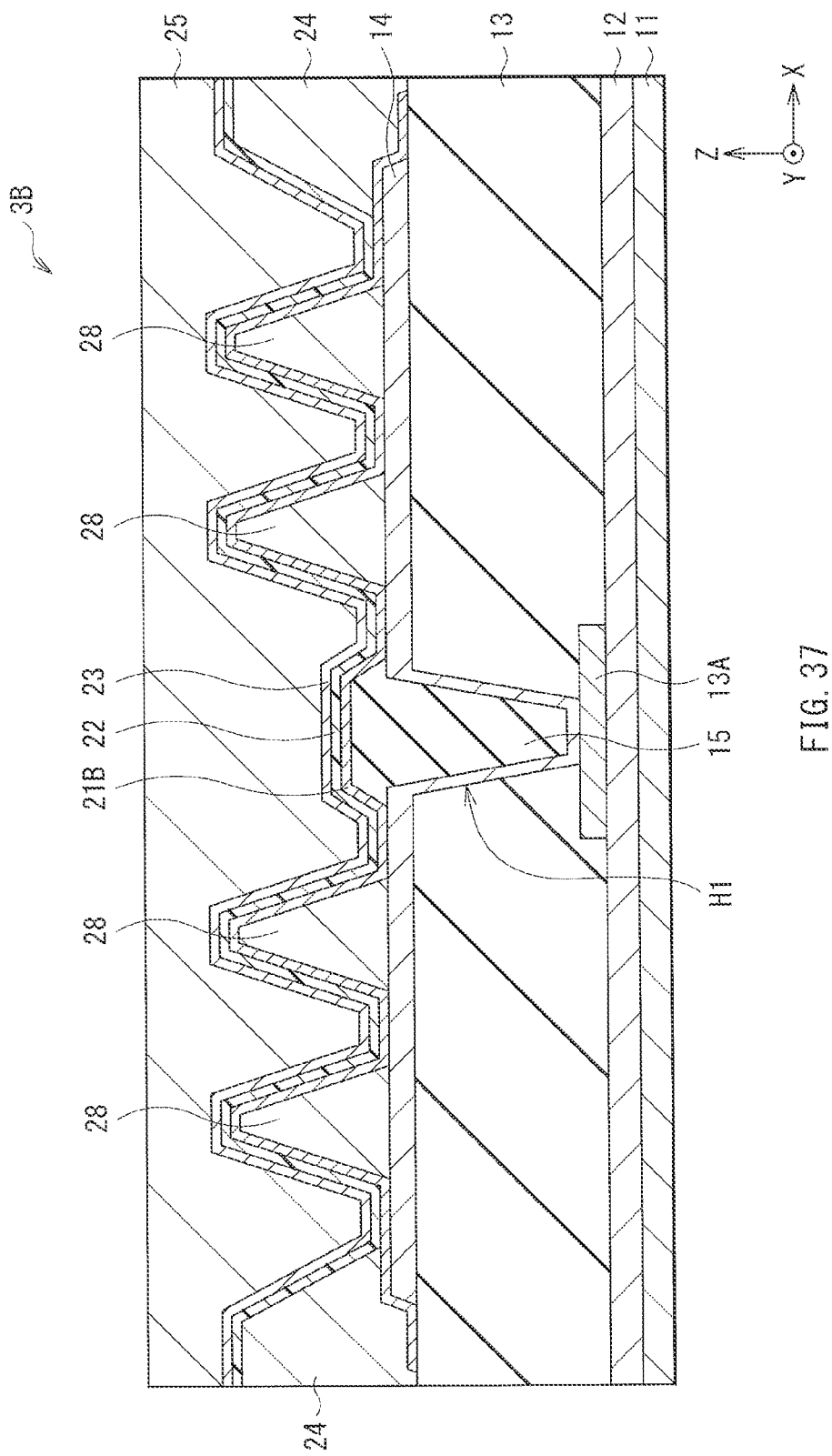
FIG. 37 is a sectional view illustrating a configuration of a display unit according to Modification Example 9.

FIG. 37 illustrates a sectional configuration of a display unit (a display unit 3B) according to Modification Example 9. In the display unit 3B, the end of the first electrode 21 together with the end of the relay electrode 14 is covered with the partition wall 24. Except of this point, the display unit 3B has a configuration similar to that of the display unit 3, and has functions and effects similar to those of the display unit 3.

The first electrode 21 of the display unit 3B covers the partition wall 28. In other words, the first electrode 21 is provided on the side surface of the partition wall 28. The first electrode 21 may extend, for example, throughout a wider region than the relay electrode 14 in a plan view to cover the end of the relay electrode 14. Thus, in the display unit 3B in which the end of the first electrode 21 is covered with the partition wall 24, in a manner similar to the description of the display unit 1D (refer to FIG. 16), the occurrence of a short circuit between the first electrode 21 and the second electrode 23 caused by the thickness of the first electrode 21 is suppressed.

Fourth Embodiment

Figure 38:
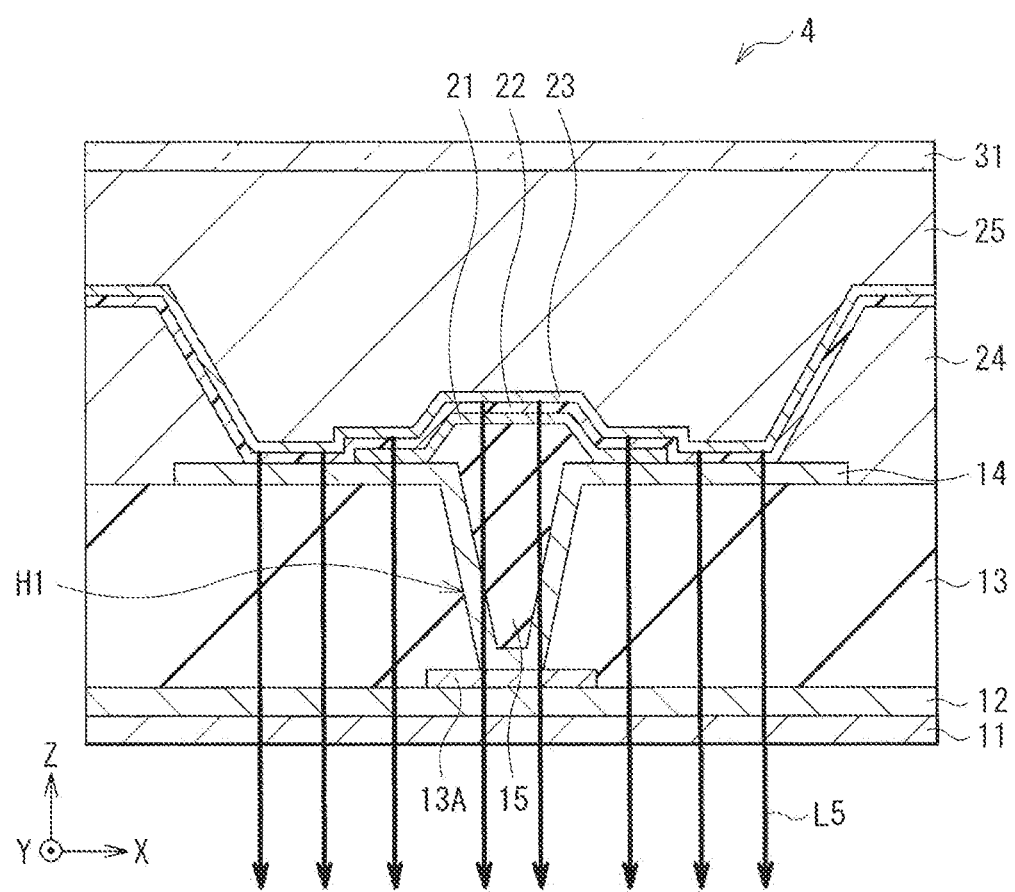
FIG. 38 is a sectional view illustrating a configuration of a main part of a display unit according to a fourth embodiment of the present technology.

FIG. 38 illustrates a sectional configuration of a main part of a display unit (a display unit 4) according to a fourth embodiment of the present technology. The display unit 4 is a bottom emission type display unit, and light (light L5) emitted from the organic light-emitting device 20 is extracted from the substrate 11. Except for this point, the display unit 4 has a configuration similar to that of the display unit 1, and has functions and effects similar to those of the display unit 1.

In the display unit 4, for example, each of the drive wire 13A, the relay electrode 14, and the first electrode 21 may be made of a conductive material with high light transmittance, and the second electrode 23 may be made of a conductive material with reflectivity. Examples of the conductive material with high light transmittance may include the materials of the second electrode 23 described in the above-described display unit 1, and examples of the conductive material with light reflectivity may include the materials of the first electrode 21 and the relay electrode 14 described in the above-described display unit 1.

Light toward the first electrode 21 of the light emitted from the organic light-emitting device 20 passes through the first electrode 21 to be extracted from the substrate 11. Light toward the second electrode 23 of the light emitted from the organic light-emitting device 20 is reflected by the second electrode 23, and passes through the organic layer 22 and the first electrode 21 to be extracted from the substrate 11.

APPLICATION EXAMPLES

Next, application examples of the above-described display units (the display units 1, 1A, 1B, 1C, 1D, 1E, 2, 2A, 3, 3A, and 4) to electronic apparatuses will be described below. Examples of the electronic apparatuses may include televisions and smartphones. In addition, the above-described display units are applicable to electronic apparatuses in any fields that display, as an image or a picture, an image signal input from an external device or an image signal produced inside, and are applicable to, for example, tablets and vehicle-mounted displays.

(Module)

Figure 39:
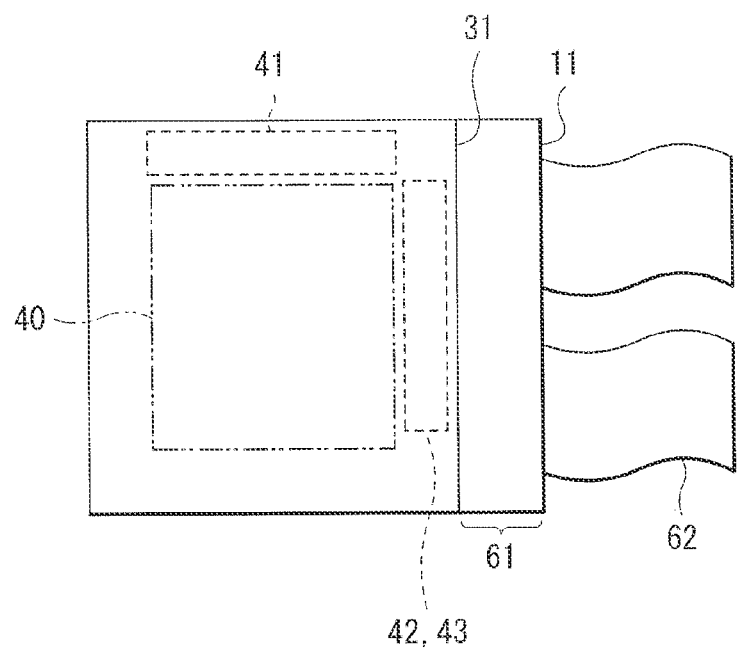

Any of the above-described display units is incorporated as, for example, a module illustrated in FIG. 39 into various electronic apparatuses such as Application Examples 1 and 2 that will be described later. This module may be configured, for example, by providing a region 61 exposed from the sealing substrate 31 on one side of the substrate 11 and extending wiring lines of a horizontal selector 41, a write scanner 42, and a power supply scanner 43 to form an external connection terminal (not illustrated) in the exposed region 61. A flexible printed circuit (FPC) 62 for signal input and output may be provided to the external connection terminal.

Application Example 1

Figure 40:
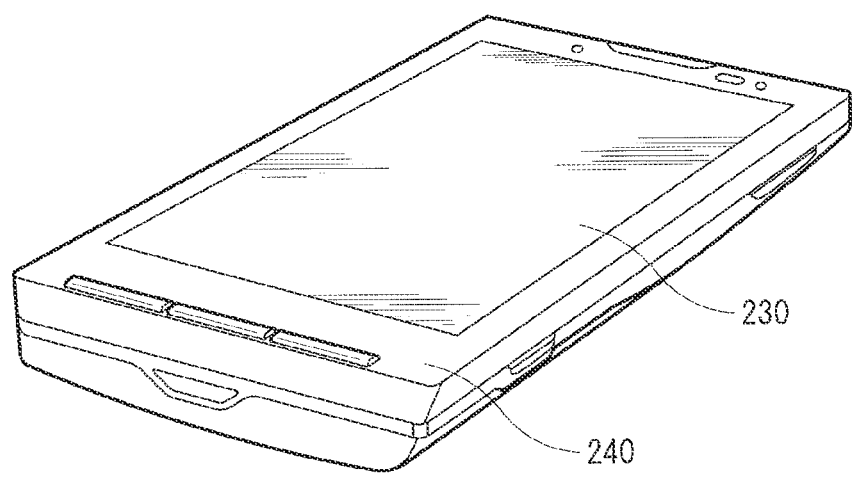
FIG. 40 is a perspective view illustrating an appearance of Application Example 1.

FIG. 40 illustrates an appearance of a smartphone to which any of the display units according to the above-described embodiments and the like is applied. The smartphone may include, for example, a display section 230 and a non-display section 240, and the display section 230 is configured of any one of the display units according to the above-described embodiments and the like. The display units according to the above-described embodiments and the like have small current density and low power consumption; therefore, the display units are suitably used for the smartphone.

Application Example 2

Figure 41:
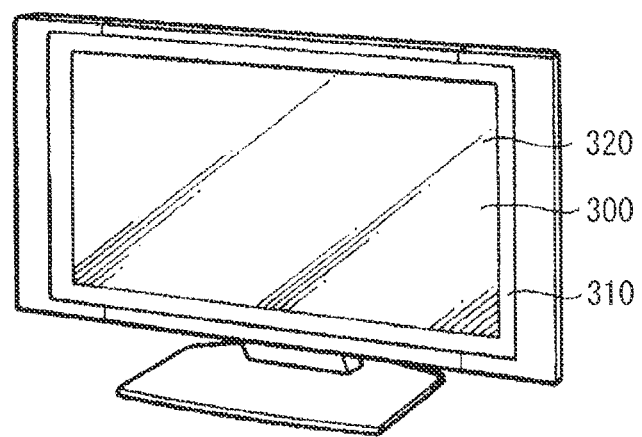
FIG. 41 is a perspective view illustrating an appearance viewed from a front side of Application Example 2.

FIG. 41 illustrates an appearance of a television to which any of the display units according to the above-described embodiments and the like is applied. The television may include, for example, an image display screen section 300 including a front panel 310 and a filter glass 320, and the image display screen section 300 is configured of any one of the display units according to the above-described embodiments and the like. In the display units according to the above-described embodiments and the like, higher definition is achievable; therefore, the display units according to the above-described embodiments and the like are suitably used for the television.

Although the present technology is described referring to the embodiments and the modification examples thereof, the present technology is not limited thereto, and may be variously modified. For example, the material and thickness of each layer, the method and conditions of forming each layer are not limited to those described in the above-described embodiments and the like, and each layer may be made of any other material with any other thickness by any other method under any other conditions.

Moreover, in the above-described embodiments and the like, a case where a light-emitting layer for white light emission including three layers, i.e., the red light-emitting layer, the green light-emitting layer, and the blue light-emitting layer is formed as the light-emitting layer is described; however, the configuration of the light-emitting layer for white light emission is not superficially limited thereto, and the light-emitting layer may have a configuration in which light-emitting layers of two colors having a complementary color relationship such as an orange light-emitting layer and a blue light-emitting layer, or a blue-green light-emitting layer and a red light-emitting layer are laminated. Further, in the above-described embodiments and the like, a case where the organic layer is used as the functional layer is described; however, an inorganic layer including the light-emitting layer may be used.

Furthermore, in the above-described embodiments and the like, a case where the first electrode 21 and the second electrode 23 serve as an anode and a cathode, respectively, is described; however, the first electrode 21 and the second electrode 23 may serve as a cathode and an anode, respectively.

In addition, in the above-described embodiments and the like, a case where the display unit is configured of three kinds of sub-pixels of red (R), green (G), and blue (B) is exemplified; however, any sub-pixel configuration may be adopted, and the display unit may be configured of, for example, four kinds of sub-pixels of red (R), green (G), blue (B), and white (W).

Moreover, in the above-described embodiments and the like, a case where the color filter 32 is provided is described; however, the display unit may be configured without providing the color filter. For example, in a case where light-emitting layers of respective colors of red, green, and blue are formed for respective sub-pixels, or a case where black-and-white display is performed, the color filter may not be provided.

It is to be noted that the effects described in this description are merely examples; therefore, effects in the present technology are not limited thereto, and the present technology may have other effects.

It is to be noted that the present technology may have the following configurations.

(1) A display unit including:
a drive wire;
a planarization layer covering the drive wire and having a connection hole;
a relay electrode provided on the planarization layer and configured to be electrically connected to the drive wire through the connection hole;
a filling member made of an insulating material and provided in the connection hole;
a first partition wall made of a same material as that of the filling member and covering an end of the relay electrode;
a first electrode covering the filling member and configured to be electrically connected to the relay electrode;
a second electrode facing the first electrode; and
a functional layer located between the first electrode and the second electrode, the functional layer including a light-emitting layer.

(2) The display unit according to (1), in which the connection hole is filled with the filling member.

(3) The display unit according to (1) or (2), in which an end of the first electrode is also covered with the first partition wall.

(4) The display unit according to any one of (1) to (3), in which the first electrode extends throughout a wider region than the relay electrode in a plan view.

(5) The display unit according to (1), in which a side wall of the first partition wall is covered with the first electrode.

(6) The display unit according to (5), further including a second partition wall covering an end of the first electrode.

(7) The display unit according to any one of (1) to (6), further including a first reflecting member on a side surface of the first partition wall.

(8) The display unit according to (1), further including a third partition wall made of a same material as that of the filling member and covering a part of the relay electrode.

(9) The display unit according to (8), in which the third partition wall is covered with the first electrode.

(10) The display unit according to (8) or (9), in which a plurality of the third partition walls are provided with spaces in between.

(11) The display unit according to any one of (8) to (10), further including a second reflecting member on a side surface of the third partition wall.

(12) The display unit according to any one of (1) to (11), in which
the first electrode includes a light-reflective material, and
the second electrode includes a light-transmissive material.

(13) The display unit according to any one of (1) to (11), in which
the relay electrode includes a light-reflective material, and
each of the first electrode and the second electrode includes a light-transmissive material.

(14) The display unit according to any one of (1) to (11), in which
each of the drive wire, the relay electrode, and the first electrode includes a light-transmissive material, and
the second electrode includes a light-reflective material.

(15) The display unit according to any one of (1) to (14), in which one relay electrode is configured to be electrically connected to the drive wire through a plurality of the connection holes.

(16) The display unit according to any one of (1) to (15), in which a thickness of the first electrode is smaller than a thickness of the relay electrode.

(17) The display unit according to any one of (1) to (16), in which the filling member and the first partition wall are in contact with each other.

(18) The display unit according to any one of (1) to (17), in which the functional layer is configured of an organic layer.

(19) An electronic apparatus provided with a display unit, the display unit including:
a drive wire;
a planarization layer covering the drive wire and having a connection hole;
a relay electrode provided on the planarization layer and configured to be electrically connected to the drive wire through the connection hole;
a filling member made of an insulating material and provided in the connection hole;
a first partition wall made of a same material as that of the filling member and covering an end of the relay electrode;
a first electrode covering the filling member and configured to be electrically connected to the relay electrode;
a second electrode facing the first electrode; and
a functional layer located between the first electrode and the second electrode, the functional layer including a light-emitting layer.

(20) A method of manufacturing a display unit including:
forming a drive wire;
forming a planarization layer covering the drive wire, and then forming a connection hole in the planarization layer;
forming a relay electrode on the planarization layer and configuring the relay electrode to be electrically connected to the drive wire through the connection hole;
forming a filling member made of an insulating material in the connection hole and forming a first partition wall covering an end of the relay electrode with use of a same material as that of the filling member;
forming a first electrode to cover the filling member and configuring the first electrode to be electrically connected to the relay electrode; and
forming a functional layer including a light-emitting layer and a second electrode in this order on the first electrode.

It should be understood by those skilled in the art that various modifications, combinations, sub-combinations, and alterations may occur depending on design requirements and other factors insofar as they are within the scope of the appended claims or the equivalents thereof.

What is claimed is:

1. A display unit comprising:
a drive wire;
a first insulating layer covering the drive wire and in direct contact with at least a portion of the drive wire, the first insulating layer including a first connection hole;
a first metal wire arranged on the first insulating layer and configured to be electrically connected to the drive wire through the connection hole;
a filling member made of an insulating material, arranged above the first metal wire and in the first connection hole;
a first electrode configured to be in direct contact with and electrically connected to the first metal wire at two locations on opposing sides of the first connection hole in a cross-section perspective;
a second insulating layer directly atop and in direct contact with an end of the first metal wire, the second insulating layer being arranged so as to not be in direct contact with the first electrode and the filling member in the cross-section perspective;
a second electrode facing the first electrode; and
a functional layer located between the first electrode and the second electrode, the functional layer including a light-emitting layer and a hole injection layer, wherein the hole injection layer is above the second insulating layer.

2. The display unit according to claim 1, wherein the first metal wire and a second metal wire face each other with a third insulating layer in between, thereby forming a capacitor.

3. The display unit according to claim 2, wherein the first insulating layer includes a second connection hole, and the first metal wire and the filling member cover the second connection hole.

4. The display unit according to claim 2, further comprising a fourth insulating layer covering the second electrode.

5. The display unit according to claim 1, wherein the light-emitting layer emits a white light.

6. The display unit according to claim 1, wherein a voltage of the first metal wire is the same as a voltage of the first electrode.

7. The display unit according to claim 1, further comprising a substrate under the drive wire.

8. The display unit according to claim 7, wherein the substrate is formed of at least one of a glass material, a plastic material, a silicon, a resin, or a metal film.

9. The display unit according to claim 7, wherein the substrate is formed of a flexible material.

10. An electronic apparatus comprising:
a display unit, the display unit including:
a drive wire;
a first insulating layer covering the drive wire and in direct contact with at least a portion of the drive wire, the first insulating layer including a first connection hole;
a first metal wire arranged on the first insulating layer and configured to be electrically connected to the drive wire through the connection hole;

a filling member made of an insulating material, arranged above the first metal wire and in the first connection hole;

a first electrode configured to be in direct contact with and electrically connected to the first metal wire at two locations on opposing sides of the first connection hole in a cross-section perspective;

a second insulating layer directly atop and in direct contact with an end of the first metal wire, the second insulating layer being arranged so as to not be in direct contact with the first electrode and the filling member in the cross-section perspective;

a second electrode facing the first electrode; and a functional layer located between the first electrode and the second electrode, the functional layer including a light-emitting layer and a hole injection layer, wherein the hole injection layer is above the second insulating layer.

11. The electronic apparatus according to claim 10, wherein the first metal wire and a second metal wire face each other with a third insulating layer in between, thereby forming a capacitor.

12. The electronic apparatus according to claim 11, wherein the first insulating layer includes a second connection hole, and the first metal wire and the filling member cover the second connection hole.

13. The electronic apparatus according to claim 11, wherein the display unit further comprises a fourth insulating layer covering the second electrode.

14. The electronic apparatus according to claim 10, wherein the light-emitting layer emits a white light.

15. The electronic apparatus according to claim 10, wherein a voltage of the first metal wire is the same as a voltage of the first electrode.

16. The electronic apparatus according to claim 10, wherein the display unit further comprises a substrate under the drive wire.

17. The electronic apparatus according to claim 16, wherein the substrate is formed of at least one of a glass material, a plastic material, a silicon, a resin, or a metal film.

18. The electronic apparatus according to claim 16, wherein the substrate is formed of a flexible material.

\* \* \* \* \*